US011297270B2

(12) United States Patent
Veig et al.

(10) Patent No.: US 11,297,270 B2
(45) Date of Patent: Apr. 5, 2022

(54) READOUT CIRCUIT AND METHOD FOR TIME-OF-FLIGHT IMAGE SENSOR

(71) Applicants: Sony Semiconductor Solutions Corporation, Kanagawa (JP); Sony Corporation, Tokyo (JP)

(72) Inventors: Zvika Veig, Ness Ziona (IL); Golan Zeituni, Kfar-Saba (IL); Kei Nakagawa, Kanagawa (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/828,224

(22) Filed: Mar. 24, 2020

(65) Prior Publication Data

US 2021/0203868 A1 Jul. 1, 2021

Related U.S. Application Data

(60) Provisional application No. 62/953,804, filed on Dec. 26, 2019.

(51) Int. Cl.
*H04N 5/369* (2011.01)
*H04N 5/222* (2006.01)
*H04N 5/262* (2006.01)

(52) U.S. Cl.
CPC ....... *H04N 5/36965* (2018.08); *H04N 5/2226* (2013.01); *H04N 5/262* (2013.01)

(58) Field of Classification Search
CPC .. H04N 5/36965; H04N 5/2226; H04N 5/262; H01L 27/14621; H01L 27/14645; H01L 27/14609; G01S 7/4914; G01S 17/894; G01S 7/4876; G01S 7/4863
See application file for complete search history.

(56) References Cited

U.S. PATENT DOCUMENTS

| | | | | |
|---|---|---|---|---|
| 7,623,173 | B2* | 11/2009 | Nitta | H03M 1/1023 |
| | | | | 348/302 |
| 10,101,452 | B2* | 10/2018 | Ikeno | G01S 7/4863 |
| 10,522,578 | B2* | 12/2019 | Hanzawa | G01S 7/4863 |

(Continued)

OTHER PUBLICATIONS

International Search Report and Written Opinion dated Apr. 1, 2021 for corresponding International Application No. PCT/JP2020/046675.

*Primary Examiner* — Luong T Nguyen
(74) *Attorney, Agent, or Firm* — Michael Best & Friedrich LLP

(57) ABSTRACT

A time-of-flight device comprises a pixel array including an array of pixel circuits, wherein a column of the array includes: a first pixel circuit including a first photodiode, a first capacitor and a second capacitor coupled to the first photodiode, and a second pixel circuit including a second photodiode, a third capacitor and a fourth capacitor coupled to the second photodiode, a first signal line coupled to the first capacitor, a second signal line coupled to the second capacitor, a third signal line coupled to the third capacitor, a fourth signal line coupled to the fourth capacitor, a first switch circuitry, a second switch circuitry, a first comparator coupled to the first signal line and the third signal line through the first switch circuitry, and a second comparator coupled to the second signal line and the fourth signal line through the second switch circuitry.

20 Claims, 25 Drawing Sheets

(56) References Cited

U.S. PATENT DOCUMENTS

| | | | |
|---|---|---|---|
| 2010/0073462 A1* | 3/2010 | Lee | H04N 13/25 |
| | | | 348/46 |
| 2010/0283881 A1 | 11/2010 | Araki et al. | |
| 2014/0014823 A1* | 1/2014 | Araki | H04N 5/37455 |
| | | | 250/208.1 |
| 2017/0276789 A1 | 9/2017 | Ikeno et al. | |
| 2019/0081095 A1 | 3/2019 | Hanzawa et al. | |

* cited by examiner

READOUT CIRCUIT AND METHOD FOR TIME-OF-FLIGHT IMAGE SENSOR

BACKGROUND OF THE INVENTION

1. Field of the Invention

This application relates generally image sensors. More specifically, this application relates to a system and method for distance and depth determination in a time-of-flight (TOF) image sensor.

2. Description of Related Art

Image sensing devices typically include an image sensor, generally implemented as an array of pixel circuits, as well as signal processing circuitry and any associated control or timing circuitry. Within the image sensor itself, charge is collected in a photoelectric conversion device of the pixel circuit as a result of the impingement of light. There are typically a very large number of individual photoelectric conversion devices (e.g. tens of millions), and many signal processing circuitry components working in parallel. Various components within the signal processing circuitry are shared by a large number of photoelectric conversion devices; for example, a column or multiple columns of photoelectric conversion devices may share a single analog-to-digital converter (ADC) or sample-and-hold (S/H) circuit.

BRIEF SUMMARY OF THE INVENTION

Various aspects of the present disclosure relate to an image sensor and distance determination method therein.

In one aspect of the present disclosure, there is provided a time-of-flight sensor, comprising: a pixel array including a plurality of pixel circuits arranged in an array, wherein a first column of the array includes: a first pixel circuit including a first photodiode, a first capacitor coupled to the first photodiode, and a second capacitor coupled to the first photodiode, and a second pixel circuit including a second photodiode, a third capacitor coupled to the second photodiode, and a fourth capacitor coupled to the second photodiode; a first signal line coupled to the first capacitor; a second signal line coupled to the second capacitor; a third signal line coupled to the third capacitor; a fourth signal line coupled to the fourth capacitor; a first switch circuitry; a second switch circuitry; a first comparator coupled to the first signal line and the third signal line through the first switch circuitry; and a second comparator coupled to the second signal line and the fourth signal line through the second switch circuitry.

In another aspect of the present disclosure, there is provided a time-of-flight system, comprising: a light source configured to emit a light; and a sensor comprising: a pixel array including a plurality of pixel circuits arranged in an array, wherein a column of the array includes: a first pixel circuit including a first photodiode, a first capacitor coupled to the first photodiode, and a second capacitor coupled to the first photodiode, and a second pixel circuit including a second photodiode, a third capacitor coupled to the second photodiode, and a fourth capacitor coupled to the second photodiode, a first signal line coupled to the first capacitor, a second signal line coupled to the second capacitor, a third signal line coupled to the third capacitor, a fourth signal line coupled to the fourth capacitor, a first switch circuitry, a second switch circuitry, a first comparator coupled to the first signal line and the third signal line through the first switch circuitry, and a second comparator coupled to the second signal line and the fourth signal line through the second switch circuitry.

In another aspect of the present disclosure, there is provided a system, comprising: a first sensor configured to generate an image data, the first sensor comprising a first pixel array; and a second sensor configured to generate a distance data, the second sensor comprising: a second pixel array including a plurality of pixel circuits arranged in an array, wherein a column of the array includes: a first pixel circuit including a first photodiode, a first capacitor coupled to the first photodiode, and a second capacitor coupled to the first photodiode, and a second pixel circuit including a second photodiode, a third capacitor coupled to the second photodiode, and a fourth capacitor coupled to the second photodiode, a first signal line coupled to the first capacitor, a second signal line coupled to the second capacitor, a third signal line coupled to the third capacitor, a fourth signal line coupled to the fourth capacitor, a first switch circuitry, a second switch circuitry, a first comparator coupled to the first signal line and the third signal line through the first switch circuitry, and a second comparator coupled to the second signal line and the fourth signal line through the second switch circuitry.

As such, various aspects of the present disclosure provide for improvements in at least the technical field of depth sensing, as well as the related technical fields of imaging, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in image sensors, it will be understood that this is merely one example of an implementation. It will further be understood that the disclosed systems and methods can be used in any device in which there is a need to detect distance in a wave-based sensor; for example, an audio circuit, phononic sensor, a radar system, and the like.

Imaging System

Figure 1A:
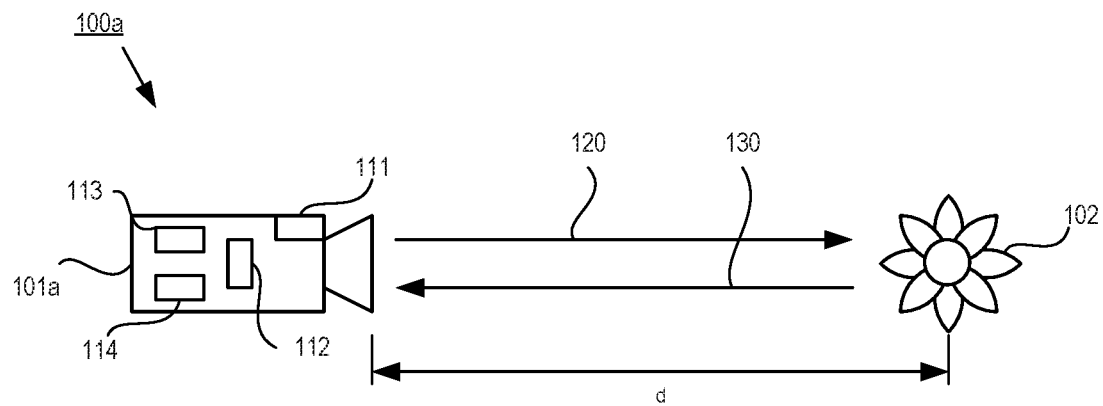
FIGS. 1A and 1B illustrate exemplary TOF systems according to various aspects of the present disclosure.

FIG. 1A illustrates a first example 100a of a TOF imaging system 101a configured to detect and/or an object 102 located a distance d away. The TOF imaging system 101a includes a light generator 111 configured to generate an emitted light wave 120 toward the object 102 and a TOF image sensor 112 configured to receive a reflected light wave 130 from the object 102. The emitted light wave 120 may have a periodic waveform. The TOF image sensor 112 may be any device capable of converting incident radiation into signals. For example, the TOF image sensor 112 may be implemented by a Complementary Metal-Oxide Semiconductor (CMOS) Image Sensor (CIS), a Charge-Coupled Device (CCD), and the like. The TOF imaging system 101a may further include distance determination circuitry such as a controller 113 (e.g., a CPU) and a memory 114, which may operate to perform one or more examples of time-of-flight processing as described further below.

Figure 1B:
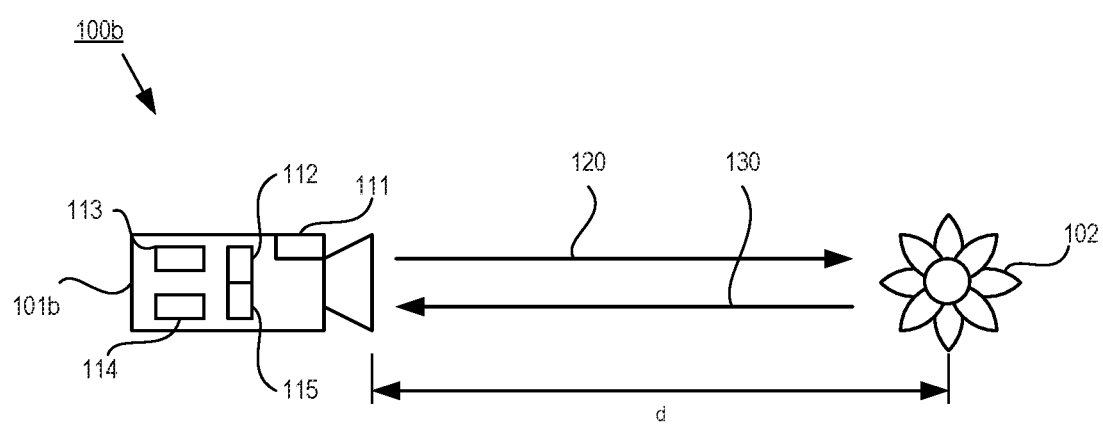

FIG. 1B illustrates a second example 100b of a TOF imaging system 101b configured to detect and/or image an object 102 located a distance d away. The TOF imaging system 101b includes a light generator 111 configured to generate an emitted light wave 120 toward the object 102, a TOF image sensor 112 configured to receive a reflected light wave 130 from the object 102, and an RGB image sensor 115 configured to capture an RGB image of the object 102. The emitted light wave 120 may have a periodic waveform. The TOF image sensor 112 may be any device capable of converting incident radiation into signals. For example, the TOF image sensor 112 and the RGB sensor 115 may each be implemented by a Complementary Metal-Oxide Semiconductor (CMOS) Image Sensor (CIS), a Charge-Coupled Device (CCD), and the like. While the second example 100b is described with reference to an RGB image sensor 115, in practice the image sensor 115 may capture a monochromatic image or may include color filters different from RGB. Furthermore, while FIG. 1B illustrates the TOF image sensor 112 and the RGB image sensor 115 as separate components, in some aspects of the present disclosure the TOF image sensor 112 and the RGB image sensor 115 may be integrated as a single chip and/or utilize a single pixel array. The TOF imaging system 101b may further include distance determination and processing circuitry such as a controller 113 (e.g., a CPU) and a memory 114, which may operate to perform one or more examples of time-of-flight and image processing as described further below.

The light generator 111 may be, for example, a light emitting diode (LED), a laser diode, or any other light generating device or combination of devices, and the light waveform may be controlled by the controller 113. The light generator may operate in the infrared range so as to reduce interference from the visible spectrum of light, although any wavelength range perceivable by the image sensor 112 may be utilized. The controller 113 may be configured to receive an image from the image sensor and calculate a depth map indicative of the distance d to various points of the object 102.

Figure 2:
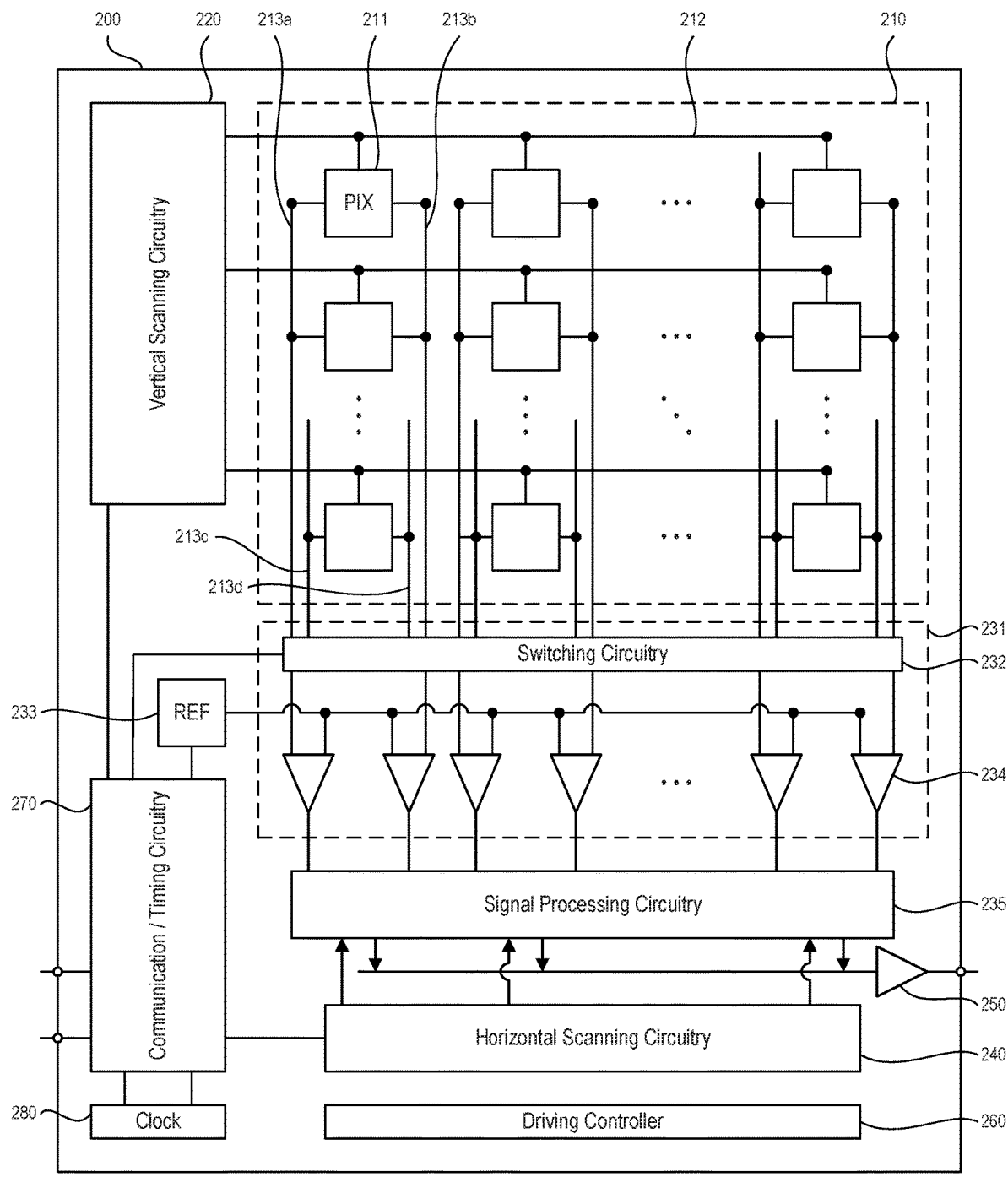
FIG. 2 illustrates an exemplary TOF sensor according to various aspects of the present disclosure.

FIG. 2 illustrates an exemplary image sensor 200 according to various aspects of the present disclosure. The image sensor 200 may be an example of the TOF image sensor 112 illustrated in FIG. 1. As illustrated in FIG. 2, the image sensor 200 includes an array 210 of pixel circuits 211, each of which are located at an intersection where a horizontal signal line 212 and a set of vertical signal lines 213a, 213b, 213c, 213d cross each other. The horizontal signal lines 212 are operatively connected to vertical scanning circuitry 220, also referred to as a "row scanning circuit" or a "vertical driving circuit," at a point outside of the pixel array 210. The horizontal signal lines 212 carry signals from the vertical scanning circuitry 220 to a particular row of the pixel circuits 211. While FIG. 2 illustrates a single horizontal signal line 212 for a given row of the pixel circuits 211, in practice a plurality of the horizontal signal lines 212 may be provided for each row of the pixel circuits 211.

The pixel circuits 211 store a charge corresponding to an amount of incident light alternately in floating diffusions FDa and FDb (for example, as illustrated in FIG. 3) and selectively output an analog signal corresponding to an amount of the charge to the vertical signal lines 213a, 213b, 213c, 213d in a manner that will be described in more detail below. While FIG. 2 illustrates the vertical signal lines 213a and 213c on one side of a given pixel circuit 211 and the vertical signal lines 213b and 213d on the other side of the given pixel circuit 211, in practice the vertical signal lines 213a, 213b, 213c, 213d may all be provided on a single side of the given pixel circuit 211; or one of the vertical signal lines 213a, 213b, 213c, 213d may be on one side of the given pixel circuit 211 and the other three of the vertical signal lines 213a, 213b, 213c, 213d may be on the other side of the given pixel circuit 211. Furthermore, for illustration purposes, only a subset of the pixel circuits 211 in the array 210 are actually shown in FIG. 2; however, in practice the image sensor 200 may have any number of the pixel circuits 211. FIG. 2 illustrates two vertical signal lines 213a and 213b or 213c and 213d for each of the pixel circuits 211 (a "two-tap" system); however, in practice the image sensor 200 may incorporate a larger number of the vertical signal lines for each column of the pixel circuits 211.

The pixel circuits 211 in some rows of the array 210 are connected to the vertical signal lines 213a and 213b, while the pixel circuits 211 in other rows of the array 210 are connected to the vertical signal lines 213c and 213d. In some aspects, the pixel circuits 211 are connected to particular vertical signal lines in groups of four rows; that is, the pixel circuits 211 in the first four rows of the array 210 are connected to the vertical signal lines 213a and 213b, the pixel circuits 211 in the second four rows of the array 210 are connected to the vertical signal lines 213c and 213d, the pixel circuits in the third four rows of the array 210 are connected to the vertical signal lines 213c and 213d, and so on.

The vertical signal lines 213a, 213b, 213c, 213d conduct the analog signals (A for the vertical signal lines 213a and 213c and B for the vertical signal lines 213b and 213c) for a particular column to a readout circuit 231, which includes a switching circuit 232 and includes two comparators 234 for each column of the pixel circuits 211. Each comparator 234 compares an analog signal to a reference signal output from a reference signal generator 233. The reference signal generator 233 may be, for example, a digital-to-analog converter (DAC) and the reference signal may have, for example, a periodic ramp waveform. Each comparator 234 outputs a digital signal indicative of a comparison between the input analog signal from the corresponding signal line input and the reference signal.

The output of the readout circuit 231 is provided to a signal processing circuit 235. The signal processing circuit 235 may include additional components, such as counters, latches, S/H circuits, and the like. The signal processing circuit 235 may be capable of performing a method of correlated double sampling (CDS). CDS is capable of overcoming some pixel noise related issues by sampling each pixel circuit 211 twice. First, the reset voltage $V_{reset}$ of a pixel circuit 211 is sampled. This may also be referred to as the P-phase value or cds value. Subsequently, the data voltage $V_{data}$ of the pixel circuit 211 (that is, the voltage after the pixel circuit 211 has been exposed to light) is sampled. This may also be referred to as the D-phase value or light-exposed value. The reset value $V_{reset}$ is then subtracted from the data value $V_{data}$ to provide a value which reflects the amount of light falling on the pixel circuit 211. The CDS method may be performed for each tap of the pixel circuit 211.

Various components of the signal processing circuit are controlled by horizontal scanning circuitry 240, also known as a "column scanning circuit" or "horizontal driving circuit." The horizontal scanning circuitry 240 causes the signal processing circuit to output signals via an output circuit 250 for further processing, storage, transmission, and the like. The vertical scanning circuitry 220, the switching circuit 232, the reference circuit generator 233, and the horizontal circuitry 240 may operate under the control of a driving controller 260 and/or communication and timing circuitry 270, which may in turn operate based on a clock circuit 280. The clock circuit 280 may be a clock generator, which generates one or more clock signals for various components of the image sensor 200. Additionally or alternatively, the clock circuit 280 may be a clock converter, which converts one or more clock signals received from outside the image sensor 200 and provides the converted clock signal(s) to various components of the image sensor 200.

Figure 3A:
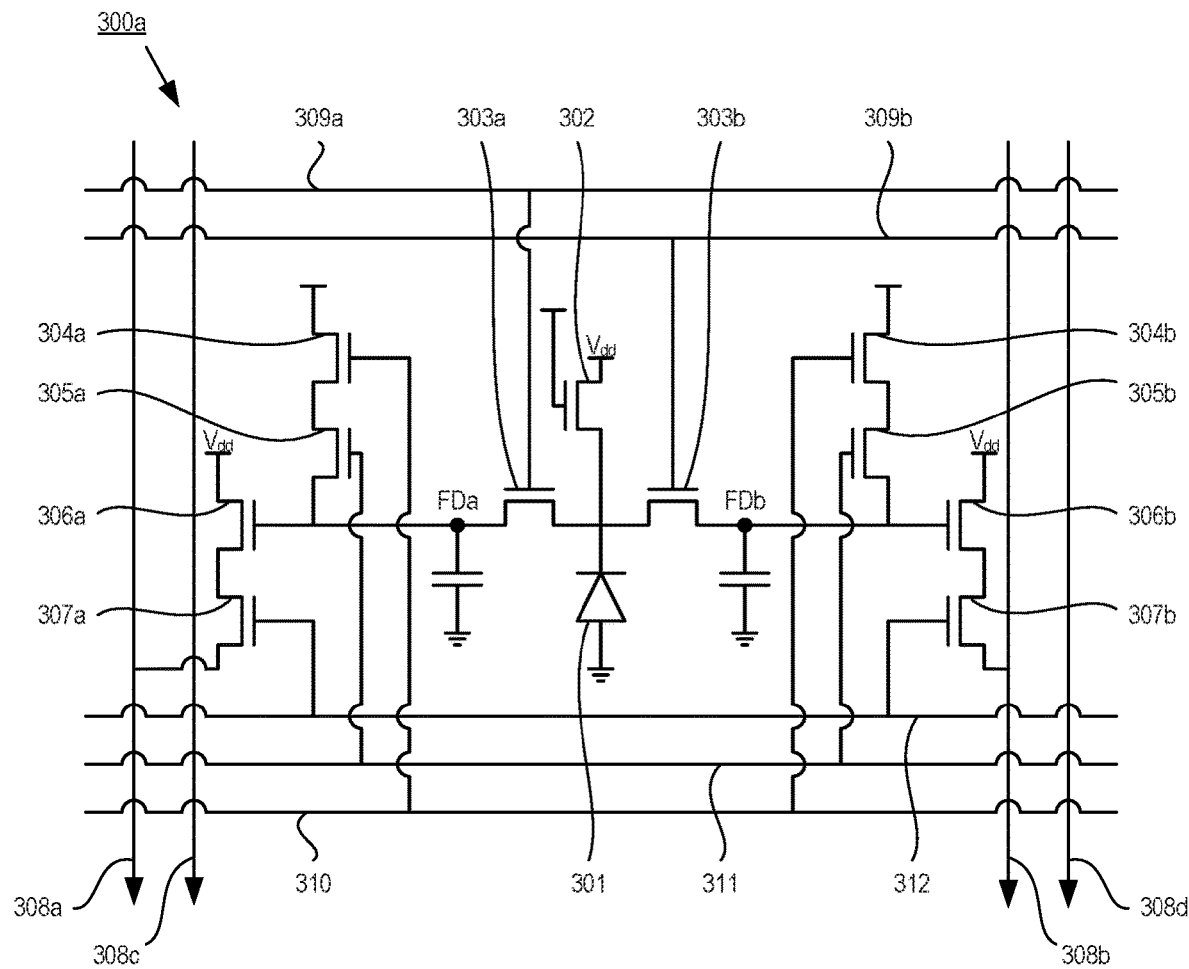
FIGS. 3A and 3B illustrate exemplary pixel circuits according to various aspects of the present disclosure.

FIG. 3A illustrates a first exemplary pixel circuit 300a having a two-tap configuration. The pixel circuit 300a may be an example of the pixel circuit 211 illustrated in the first row or second row of the array 210 in FIG. 2. As shown in FIG. 3A, the pixel circuit 300a includes a photoelectric conversion device 301 (e.g., a photodiode), a pixel reset transistor 302, a first transfer transistor 303a, a second transfer transistor 303b, a first floating diffusion FDa, a second floating diffusion FDb, a first tap reset transistor 304a, a second tap reset transistor 304b, a first intervening transistor 305a, a second intervening transistor 305b, a first amplifier transistor 306a, a second amplifier transistor 306b, a first selection transistor 307a, and a second selection transistor 307b. The photoelectric conversion device 301, the first transfer transistor 303a, the first tap reset transistor 304a, the first intervening transistor 305a, the first amplifier transistor 306a, and the first selection transistor 307a are controlled to output an analog signal (A) via a first vertical signal line 308a, which may be an example of the vertical signal line 213a illustrated in FIG. 2. This set of components may be referred to as "Tap A." The photoelectric conversion device 301, the second transfer transistor 303b, the second tap reset transistor 304b, the second intervening transistor 305b, the second amplifier transistor 306b, and the second selection transistor 307b are controlled to output an analog signal (B) via a second vertical signal line 308b, which may be an example of the vertical signal line 213b illustrated in FIG. 2. This set of components may be referred to as "Tap B." FIG. 3A also illustrates a third vertical signal line 308c, which may be an example of the vertical signal line 213c illustrated in FIG. 2, and a fourth vertical signal line 308d, which may be an example of the vertical signal line 213d illustrated in FIG. 2. As illustrated in FIG. 3A, however, the pixel circuit 300a is not connected to the third vertical signal line 308c or the fourth vertical signal line 308d.

Figure 3B:
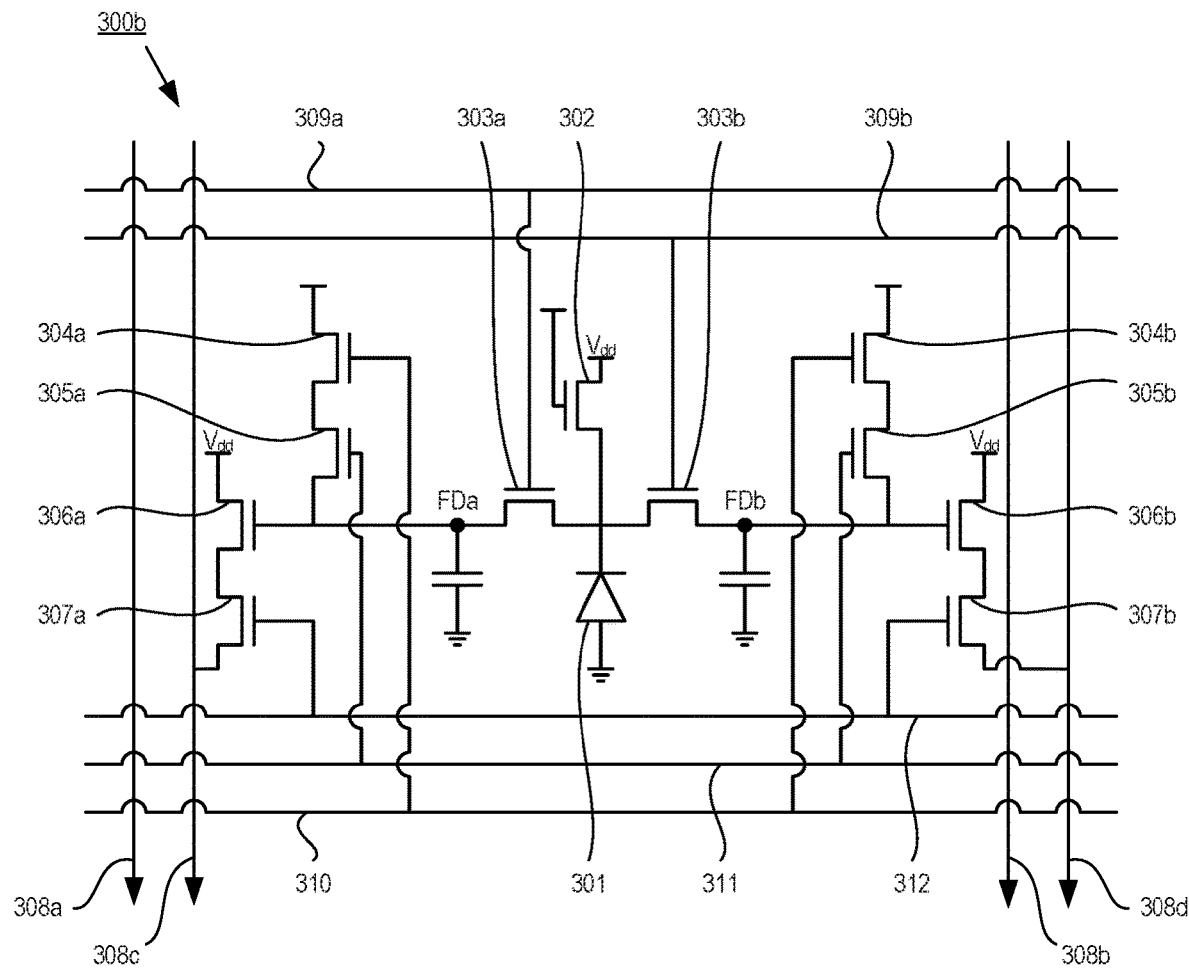

FIG. 3B illustrates a second exemplary pixel circuit 300b having a two-tap configuration. The pixel circuit 300b may be an example of the pixel circuit 211 illustrated in the last row of the array 210 in FIG. 2. As shown in FIG. 3B, the pixel circuit 300b has structural similarities to the pixel circuit 300a of FIG. 3A, and includes a photoelectric conversion device 301 (e.g., a photodiode), a pixel reset transistor 302, a first transfer transistor 303a, a second transfer transistor 303b, a first floating diffusion FDa, a second floating diffusion FDb, a first tap reset transistor 304a, a second tap reset transistor 304b, a first intervening transistor 305a, a second intervening transistor 305b, a first amplifier transistor 306a, a second amplifier transistor 306b, a first selection transistor 307a, and a second selection transistor 307b. The photoelectric conversion device 301, the first transfer transistor 303a, the first tap reset transistor 304a, the first intervening transistor 305a, the first amplifier transistor 306a, and the first selection transistor 307a are controlled to output an analog signal (A) via the third vertical signal line 308c. This set of components may be referred to as "Tap A." The photoelectric conversion device 301, the second transfer transistor 303b, the second tap reset transistor 304b, the second intervening transistor 305b, the second amplifier transistor 306b, and the second selection transistor 307b are controlled to output an analog signal (B) via the fourth vertical signal line 308d. This set of components may be referred to as "Tap B." FIG. 3B also illustrates the first vertical signal line 308a and the second vertical signal line 308b. As illustrated in FIG. 3B, however, the pixel circuit 300b is not connected to the first vertical signal line 308a or the second vertical signal line 308b.

In either pixel circuit (300a or 300b), the first transfer transistor 303a and the second transfer transistor 303b are controlled by control signals on a first transfer gate line 309a and a second transfer gate line 309b, respectively. The first tap reset transistor 304a and the second tap reset transistor 304b are controlled by a control signal on a tap reset gate line 310. The first intervening transistor 305a and the second intervening transistor 305b are controlled by a control signal on a FD gate line 311. The first selection transistor 307a and the second selection transistor 307b are controlled by a control signal on a selection gate line 312. The first and second transfer gate lines 309a and 309b, the tap reset gate line 310, the FD gate line 311, and the selection gate line 312 may be examples of the horizontal signal lines 212 illustrated in FIG. 2.

In operation, the pixel circuit 300a or the pixel circuit 300b is controlled in a time-divisional manner such that, during one half of a horizontal period, incident light is converted via Tap A to generate the output signal A; and, during the other half of the horizontal period, incident light is converted via Tap B to generate the output signal B. The division of frame among the Tap A portion and the Tap B portion may be referred to as the phase of the tap. For example, where a horizontal period runs from 0 to t, the pixel circuit 300a or the pixel circuit 300b may be controlled such that Tap A operates from 0 to t/2 (0 phase) and Tap B operates from t/2 to t (180 phase), such that Tap A operates from t/4 to 3t/4 (90 phase) and Tap B operates from 0 to t/4 and from 3t/4 to t (270 phase), such that Tap A operates from t/2 to t and Tap B operates from 0 to t/2, or such that Tap A operates from 0 to t/4 and from 3t/4 to t and Tap B operates from t/4 to 3t/4. Under such an operation, the quantities Q and I for the pixel circuit 300*a* or the pixel circuit 300*b* may be defined such that Q is given by the 0 phase minus the 180 phase and I is given by the 90 phase minus the 270 phase.

While FIGS. 3A-B illustrate the pixel circuit 300*a* and the pixel circuit 300*b* having a plurality of transistors in a particular configuration, the current disclosure is not so limited and may apply to a configuration in which the pixel circuit 300*a* or the pixel circuit 300*b* includes fewer or more transistors as well as other elements, such as additional capacitors, resistors, and the like.

Readout Modes

Figure 4:
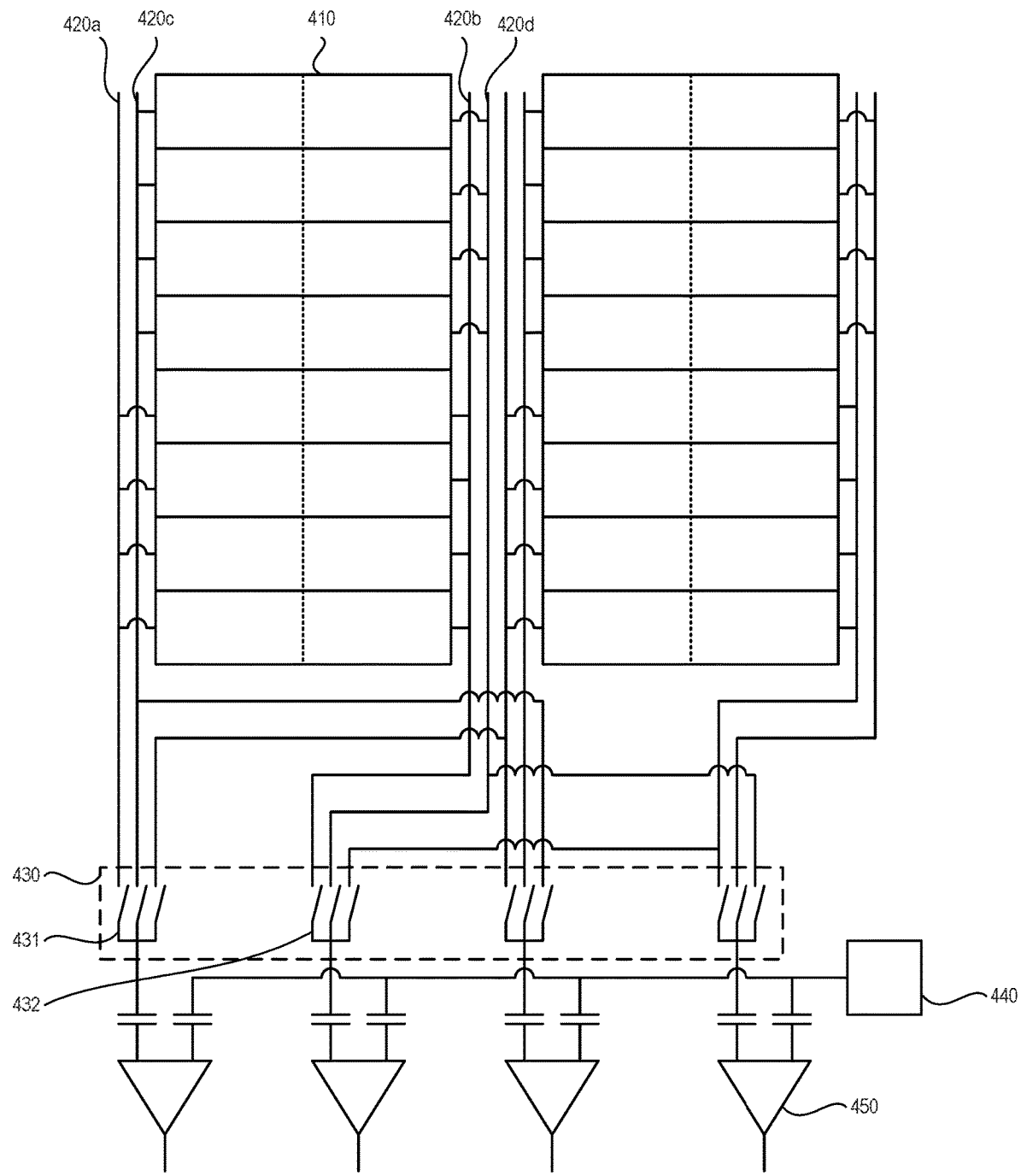
FIG. 4 illustrates an exemplary readout circuit according to various aspects of the present disclosure.

An image sensor according to the present disclosure may be capable of a plurality of different readout modes, which will be described initially with reference to FIG. 4. FIG. 4 illustrates a portion of a pixel array, such as the array 210 illustrated in FIG. 2; as well as a portion of a readout circuit, such as the readout circuit 231 illustrated in FIG. 2. Specifically, FIG. 4 illustrates two adjacent columns of pixel circuits 410, which may be the same as or similar to the pixel circuits 211 illustrated in FIG. 2 and/or the pixel circuits 300*a*, 300*b* illustrated in FIG. 3A-B; four vertical signal lines 420*a*, 420*b*, 420*c*, 420*b* for each column, which may be the same as or similar to the vertical signal lines 213*a*, 213*b*, 213*d* illustrated in FIG. 2 and/or the vertical signal lines 308*a*, 308*b*, 308*c*, 308*d* illustrated in FIG. 3A-B; a switching circuit 430, which may be the same as or similar to the switching circuit 232 illustrated in FIG. 2; a reference signal generator 440, which may be the same as or similar to the reference signal generator 233 illustrated in FIG. 2; and a plurality of comparators 450, which may be the same as or similar to the comparators 234 illustrated in FIG. 2. Each of the pixel circuits 410 are illustrated as bisected by a dashed line, thereby to illustrate the two taps of each pixel circuit 410.

The lower four pixel circuits 410 are coupled to a first vertical signal line 420*a* at one tap (for example, at the capacitor forming the first floating diffusion FDa) and coupled to a second vertical signal line 420*b* at the other tap (for example, at the capacitor forming the second floating diffusion FDb). Thus, the lower four pixel circuits 410 may each correspond to the pixel circuit 300*a* illustrated in FIG. 3A. The upper four pixel circuits 410 are coupled to a third vertical signal line 420*c* at one tap (for example, at the capacitor forming the first floating diffusion FDa) and coupled to a fourth vertical signal line 420*d* at the other tap (for example, at the capacitor forming the second floating diffusion FDb). Thus, the lower four pixel circuits 410 may each correspond to the pixel circuit 300*b* illustrated in FIG. 3B.

For a given column, the switching circuit 430 includes a first set of switch circuitry 431 and a second set of switch circuitry 432. As illustrated, each set of switch circuitry 431, 432 includes three switches, each of which may be individually controllable. The first set of switch circuitry 431 includes a first switch connected at a first end to the first vertical signal line 420*a* of the left column, a second switch connected at a first end to the third vertical signal line 420*c* of the left column, and a third switch connected at a first end to a first vertical signal line 420*a* of the right column. A second end of the first, second and third switches is coupled (as illustrated, capacitively coupled) to a first input of a first comparator 450 of the left column. The second set of switch circuitry 431 includes a first switch connected at a first end to the second vertical signal line 420*b* of the left column, a second switch connected at a first end to the fourth vertical signal line 420*d* of the left column, and a third switch connected at a first end to the second vertical signal line 420*b* of the right column. A second end of the first, second and third switches is coupled (as illustrated, capacitively coupled) to a first input of a second comparator 450 of the left column. A second input of the first comparator 450 and the second comparator 450 are coupled (as illustrated, capacitively coupled) to the reference signal generator 440.

Thus, the first comparator 450 is coupled to at least the first vertical signal line 420*a* and the third vertical signal line 420*c* through the first switch circuitry 431, and the second comparator 450 is coupled to at least the second vertical signal line 420*b* and the fourth vertical signal line 420*d* through the second switch circuitry 432. The first switch circuitry 431 and the second switch circuitry 432 may be controlled by a timing circuit, such as the communication and timing circuitry 270 illustrated in FIG. 2. The pixel circuits 411 in the left column are also coupled to the comparators 450 in the right column; for example, the third vertical signal line 420*c* is connected to a third switch of the first switch circuitry 431 in the right column, and the fourth vertical signal line 420*d* is connected to a third switch of the second switch circuitry 432 in the right column.

The various readout modes of the portion of the readout circuit illustrated in FIG. 4 are described in more detail with regard to FIGS. 5A-14B. The components illustrated in FIGS. 5A-14B correspond to those illustrated in FIG. 4, and thus a detailed description of the components is not repeated.

Figure 5A:
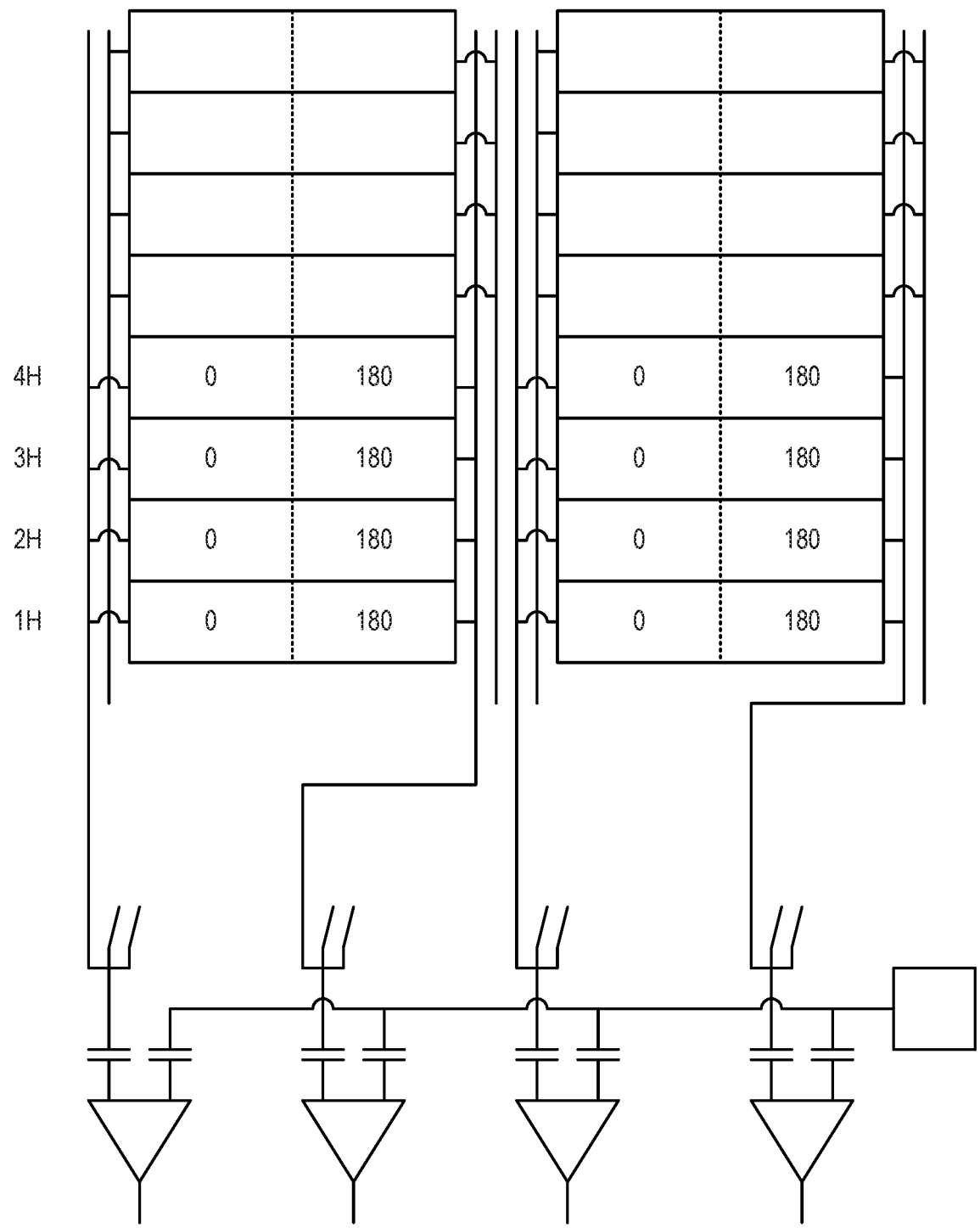
FIGS. 5A-9B illustrate exemplary readout modes and operations in the exemplary readout circuit of FIG. 4.

FIGS. 5A-D illustrate a so-called normal mode for an $N^{th}$ frame to an $(N+3)^{th}$ frame, respectively. In FIG. 5A, the $N^{th}$ frame is illustrated. As illustrated, the first switch of each of the first switch circuitry 431 and the second switch circuitry 432 is closed, while the second and third switches of each of the first switch circuitry 431 and the second switch circuitry 432 are open. The pixel circuits 410 in the bottom four rows are driven in four consecutive horizontal periods 1H to 4H such that, in a respective horizontal period Tap A of the corresponding pixel circuit 410 operates in the 0 phase and Tap B of the corresponding pixel circuit 410 operates in the 180 phase.

Figure 5B:
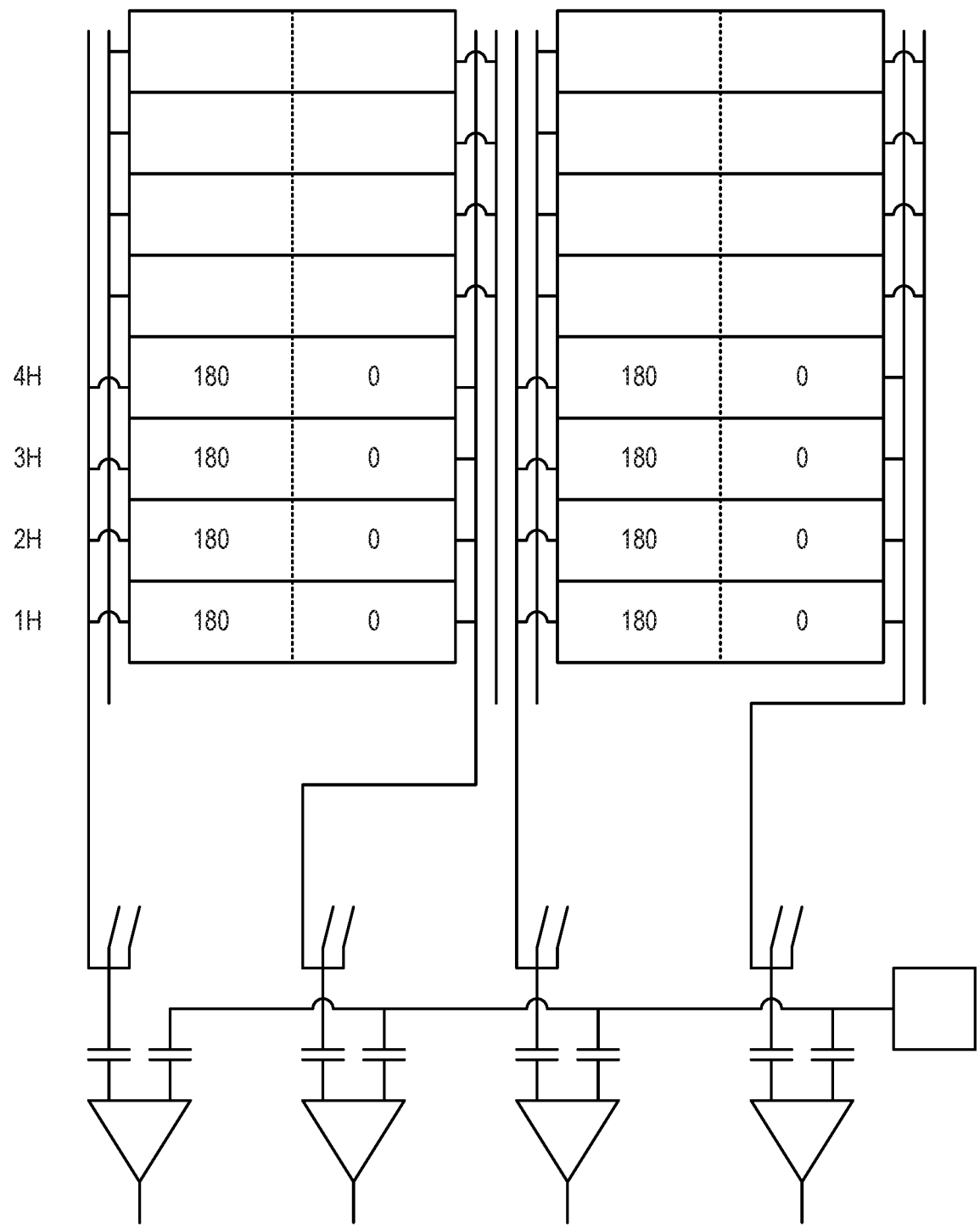

In FIG. 5B, an $(N+1)^{th}$ frame is illustrated. As illustrated, the states of the first switch circuitry 431 and the second switch circuitry 432 are the same as in FIG. 5A; however, the phases of the pixel circuits 410 are modified. Thus, the pixel circuits 410 in the bottom four rows are driven in four consecutive horizontal periods 1H to 4H such that, in a respective horizontal period Tap A of the corresponding pixel circuit 410 operates in the 180 phase and Tap B of the corresponding pixel circuit 410 operates in the 0 phase.

Figure 5C:
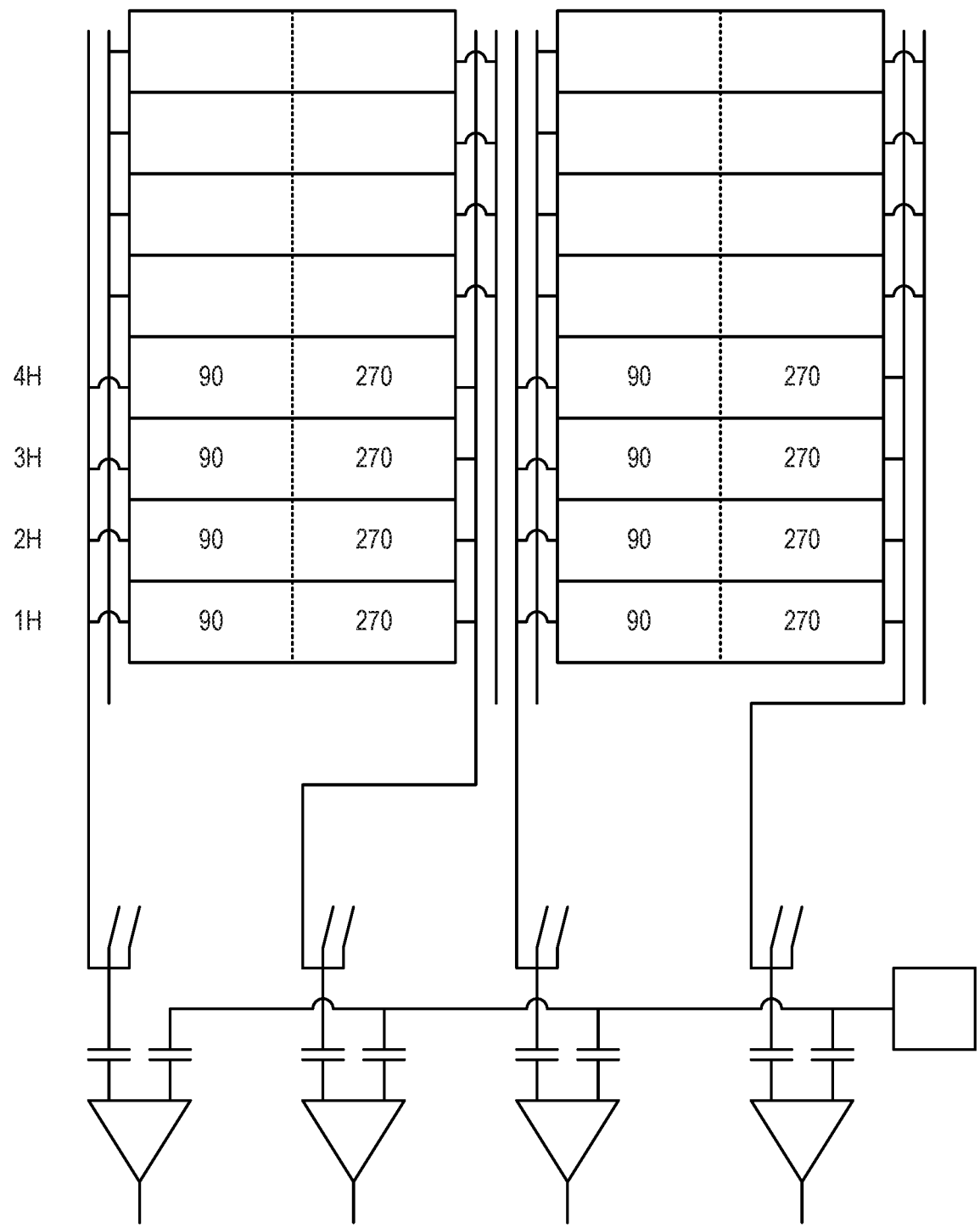

In FIG. 5C, an $(N+2)^{th}$ frame is illustrated. As illustrated, the states of the first switch circuitry 431 and the second switch circuitry 432 are the same as in FIG. 5A; however, the phases of the pixel circuits 410 are modified. Thus, the pixel circuits 410 in the bottom four rows are driven in four consecutive horizontal periods 1H to 4H such that, in a respective horizontal period Tap A of the corresponding pixel circuit 410 operates in the 90 phase and Tap B of the corresponding pixel circuit 410 operates in the 2700 phase.

Figure 5D:
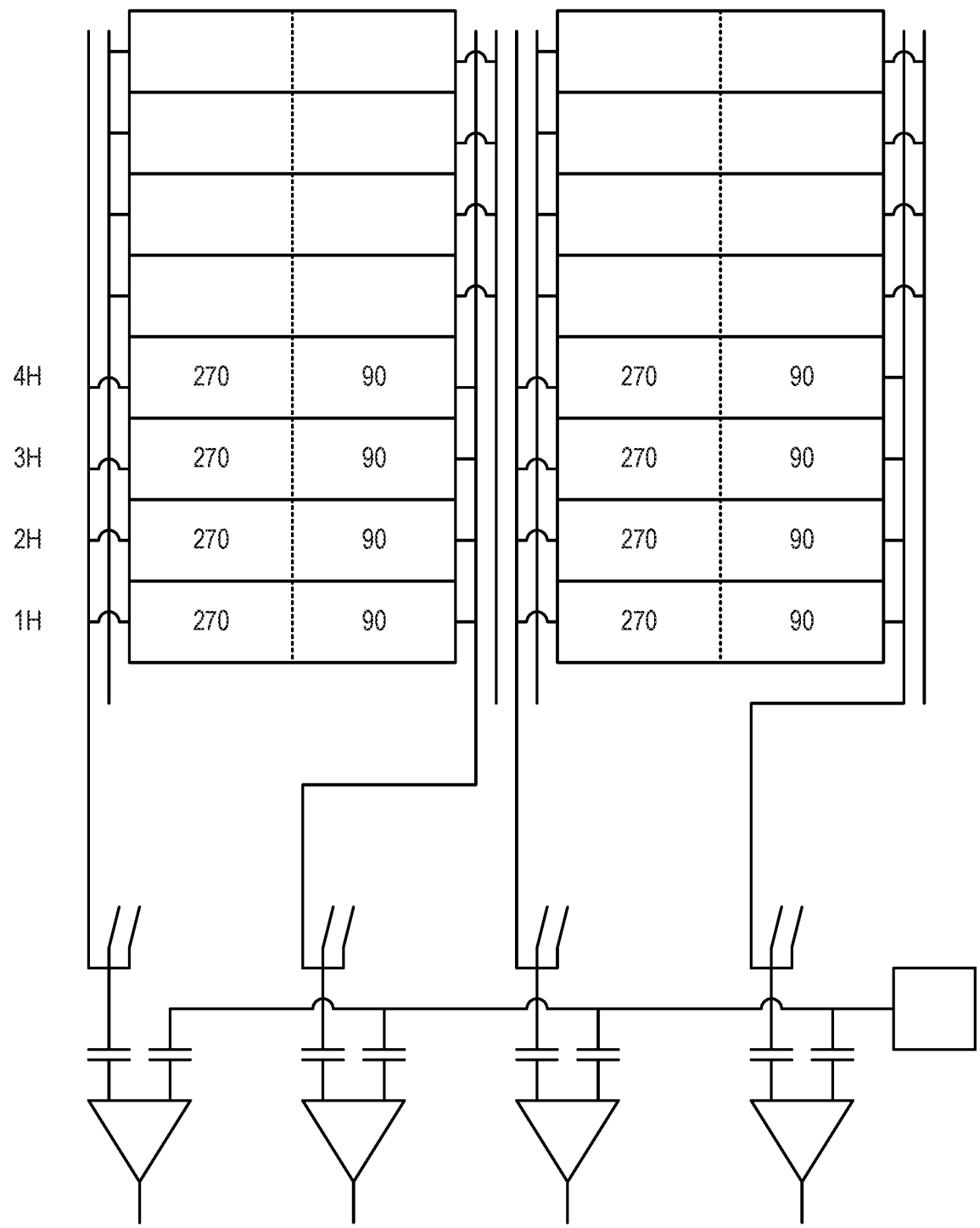

In FIG. 5D, an $(N+3)^{th}$ frame is illustrated. As illustrated, the states of the first switch circuitry 431 and the second switch circuitry 432 are the same as in FIG. 5A; however, the phases of the pixel circuits 410 are modified. Thus, the pixel circuits 410 in the bottom four rows are driven in four consecutive horizontal periods 1H to 4H such that, in a respective horizontal period Tap A of the corresponding pixel circuit 410 operates in the 270 phase and Tap B of the corresponding pixel circuit 410 operates in the 90 phase.

The outputs for each frame and/or each horizontal period within a frame may be stored in a memory. After the four frames, the quantities Q and I may be calculated as described above. In some aspects of the present disclosure, the quantities Q and I are calculated in signal processing circuitry disposed subsequent to the comparators 450, such as the signal processing circuitry 235 illustrated in FIG. 2. The signal processing circuitry may include the memory and calculation circuitry such as a processor (e.g., a CPU or a FPGA).

Figure 6:
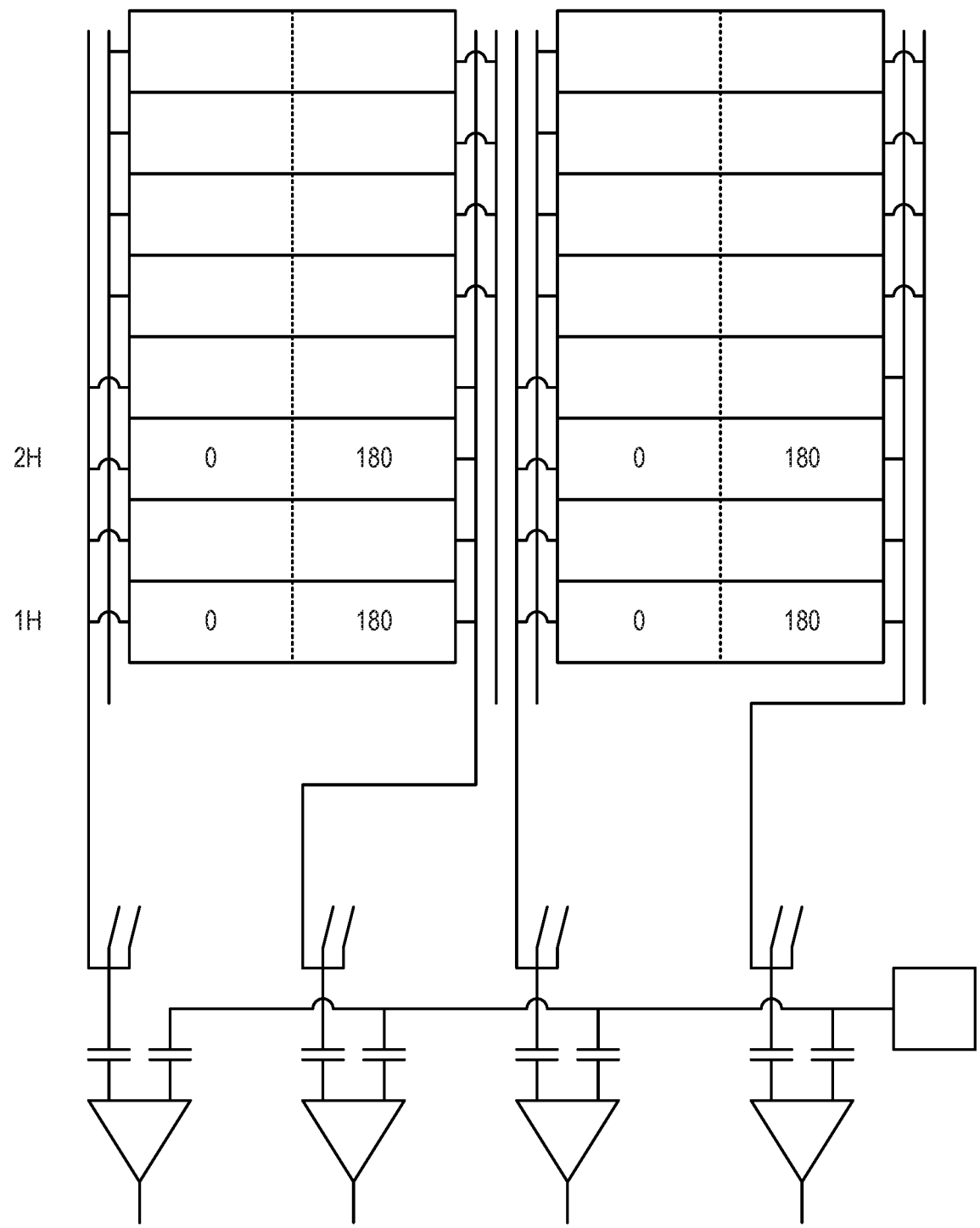

FIG. 6 illustrates a so-called pixel thinning or pixel skipping mode for an $N^{th}$ frame. In particular, FIG. 6 illustrates a "skip 1" mode where one row of pixels is skipped; however, the present disclosure may also be implemented with a "skip 2" readout mode where two rows of pixels are skipped. As illustrated in FIG. 6, the first switch of each of the first switch circuitry 431 and the second switch circuitry 432 is closed, while the second and third switches of each of the first switch circuitry 431 and the second switch circuitry 432 are open. Every other one of the pixel circuits 410 in the bottom four rows are driven in two consecutive horizontal periods 1H to 2H such that, in a respective horizontal period Tap A of the corresponding pixel circuit 410 operates in the 0 phase and Tap B of the corresponding pixel circuit 410 operates in the 180 phase.

In FIG. 6, the pixel circuits 410 in the bottom row and the pixel circuits 410 in the third-from-the-bottom row are read out in the frame, while the pixel circuits 410 in the second-from-the-bottom row and the pixel circuits 410 in the fourth-from-the-bottom row are skipped. Subsequent to the $N^{th}$ frame illustrated in FIG. 6, the phases of the pixel circuits 410 may be modified in the manner described above with respect to FIGS. 5A-D for the $(N+1)^{th}$ frame to the $(N+3)^{th}$ frame. Thus, after the four frames, the quantities Q and I may be calculated. In comparison to the normal mode of FIGS. 5A-D, however, the skip 1 mode may be implemented in half the time because only half the horizontal periods are included in each frame.

Figure 7:
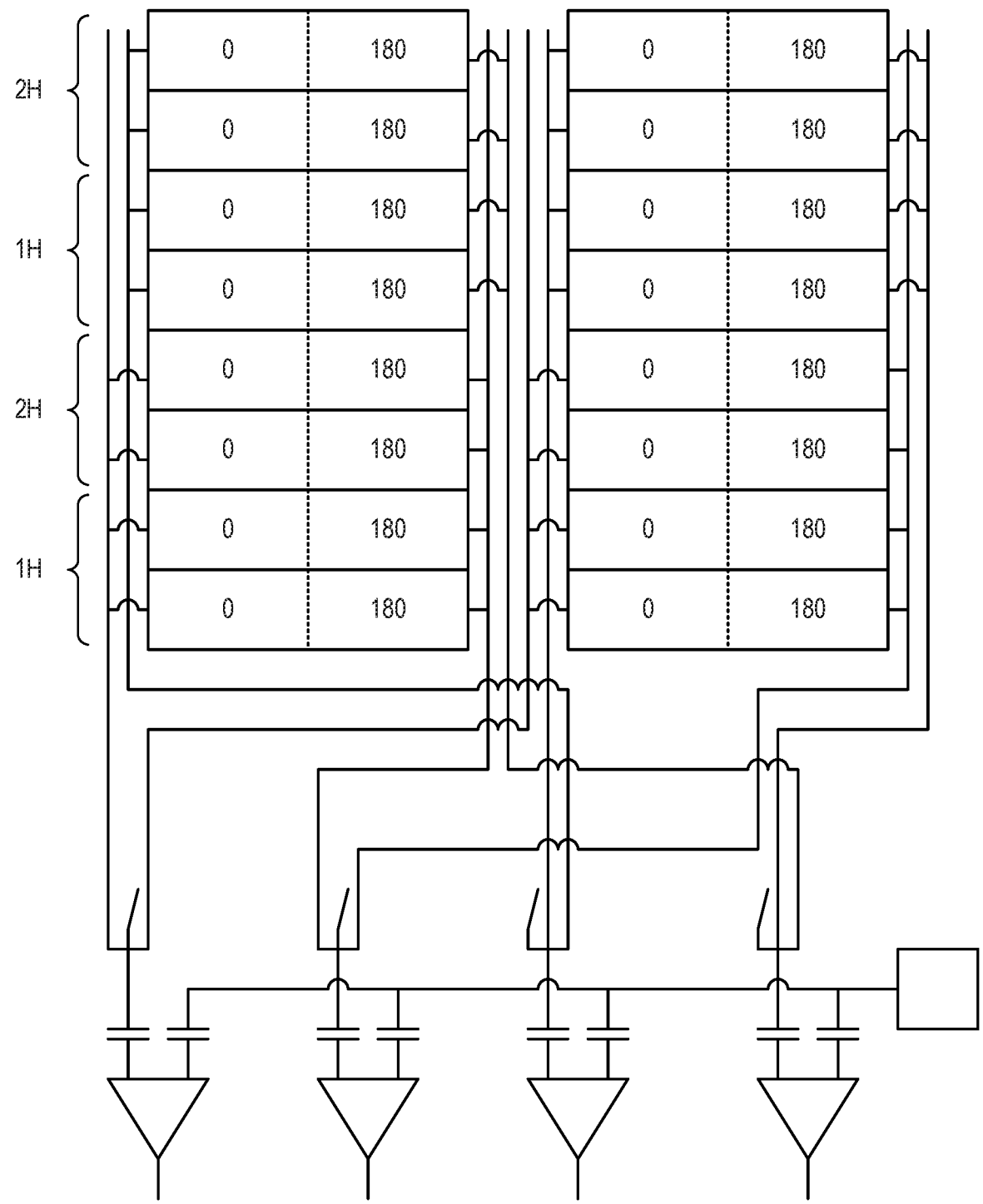

FIG. 7 illustrates a so-called pixel binning mode for an $N^{th}$ frame. In particular, FIG. 7 illustrates a "2×2 binning" mode where groups of four pixels are binned; however, the present disclosure may be implemented with a "2×4 binning mode," a "1×2 binning mode," a "1×4 binning mode," and the like. As illustrated in FIG. 7, the first and third switches of each of the first switch circuitry 431 and the second switch circuitry 432 are closed, while the second switch of each of the first switch circuitry 431 and the second switch circuitry 432 is open.

In a first horizontal period 1H, the first, second, fifth, and sixth rows (counting from the bottom) of pixel circuits 410 are driven such that Tap A of the corresponding pixel circuit 410 operates in the 0 phase and Tap B of the corresponding pixel circuit 410 operates in the 180 phase. During the first horizontal period 1H, the signals for the first and second rows of the pixel circuits 410 in both the left column and the right column are provided to the comparators 450 for the left column through the first switch circuitry 431 and the second switch circuitry 432 for the left column, while the signals for the fifth and sixth rows of the pixel circuits 410 in both the left column and the right column are provided to the comparators 450 for the right column through the first switch circuitry 431 and the second switch circuitry 432 for the right column.

In a second horizontal period 2H, the third, fourth, seventh, and eighth rows of pixel circuits 410 are driven such that Tap A of the corresponding pixel circuit 410 operates in the 0 phase and Tap B of the corresponding pixel circuit 410 operates in the 180 phase. During the second horizontal period 2H, the signals for the third and fourth rows of the pixel circuits 410 in both the left column and the right column are provided to the comparators 450 for the left column through the first switch circuitry 431 and the second switch circuitry 432 for the left column, while the signals for the seventh and eighth rows of the pixel circuits 410 in both the left column and the right column are provided to the comparators 450 for the right column through the first switch circuitry 431 and the second switch circuitry 432 for the right column.

Subsequent to the $N^{th}$ frame illustrated in FIG. 7, the phases of the pixel circuits 410 may be modified in the manner described above with respect to FIGS. 5A-D for the $(N+1)^{th}$ frame to the $(N+3)^{th}$ frame. Thus, after the four frames, the quantities Q and I may be calculated. In comparison to the normal mode of FIGS. 5A-D, however, the 2×2 binning mode may be implemented in half the time because only half the horizontal periods are included in each frame.

Figure 8:
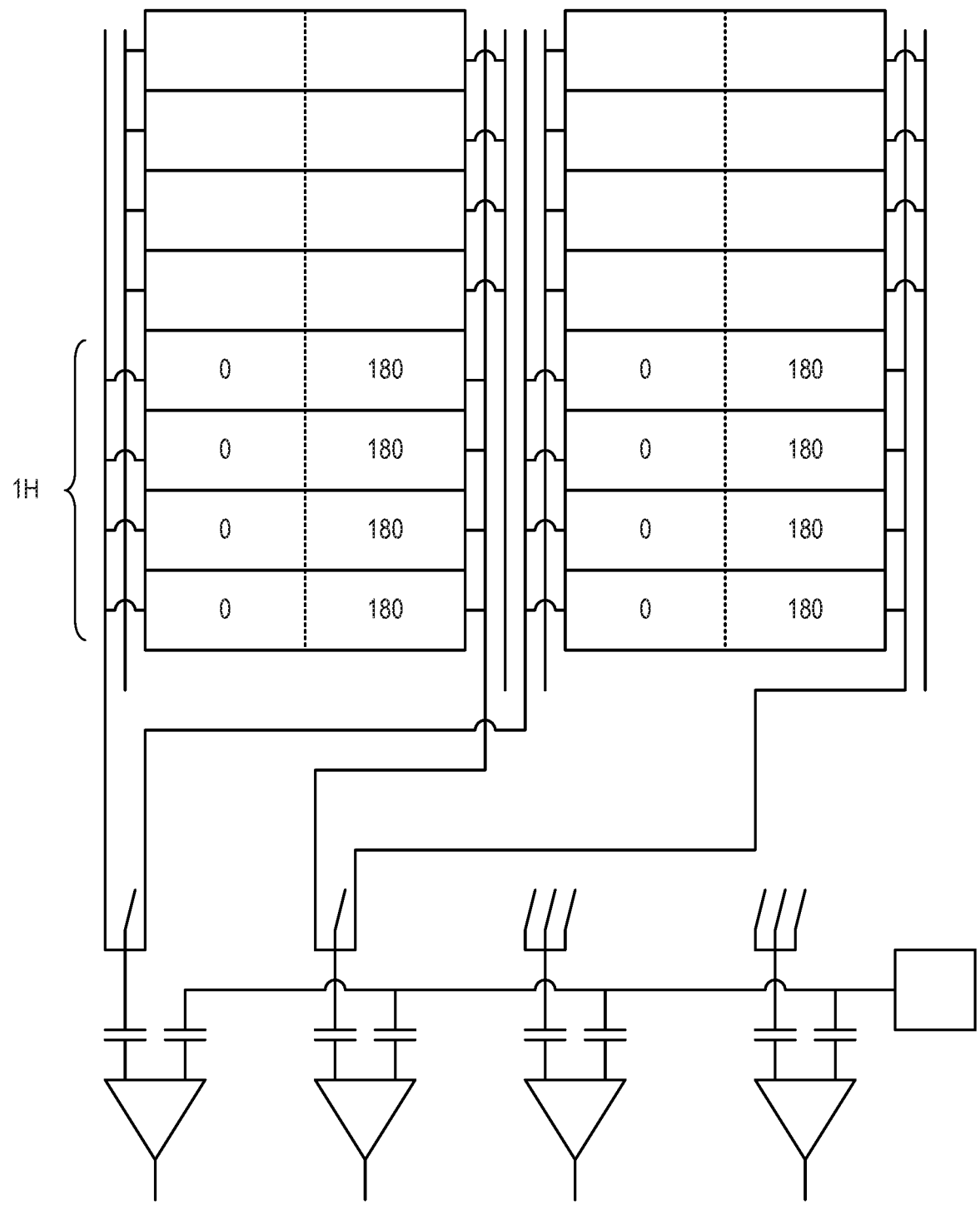

The binning and skipping modes may be combined into a hybrid mode. FIG. 8 illustrates such a hybrid mode with 2×4 binning and skip 2 implemented. As illustrated in FIG. 8, the first and third switches of the first switch circuitry 431 and the second switch circuitry 432 in the left column are closed, while the second switch of each of the first switch circuitry 431 and the second switch circuitry 432 in the left column is open. All three switches of the first switch circuitry 431 and the second switch circuitry 432 in the right column are open.

In a first horizontal period 1H, the bottom four rows of pixel circuits 410 are driven such that Tap A of the corresponding pixel circuit 410 operates in the 0 phase and Tap B of the corresponding pixel circuit 410 operates in the 180 phase. During the first horizontal period 1H, the signals for the bottom four rows of the pixel circuits 410 in both the left column and the right column are provided to the comparators 450 for the left column through the first switch circuitry 431 and the second switch circuitry 432 for the left column.

The next four rows of pixel circuits 410 are skipped, such that in a second horizontal period 2H the bottom four rows of the next set of eight pixel circuits (not illustrated in FIG. 8) are driven. Subsequent to the $N^{th}$ frame illustrated in FIG. 8, the phases of the pixel circuits 410 may be modified in the manner described above with respect to FIGS. 5A-D for the $(N+1)^{th}$ frame to the $(N+3)^{th}$ frame. Thus, after the four frames, the quantities Q and I may be calculated. In comparison to the normal mode of FIGS. 5A-D, however, the 2×4 skip 2 mode may be implemented in one-quarter of the time because only one-quarter of the horizontal periods are included in each frame.

Figure 9A:
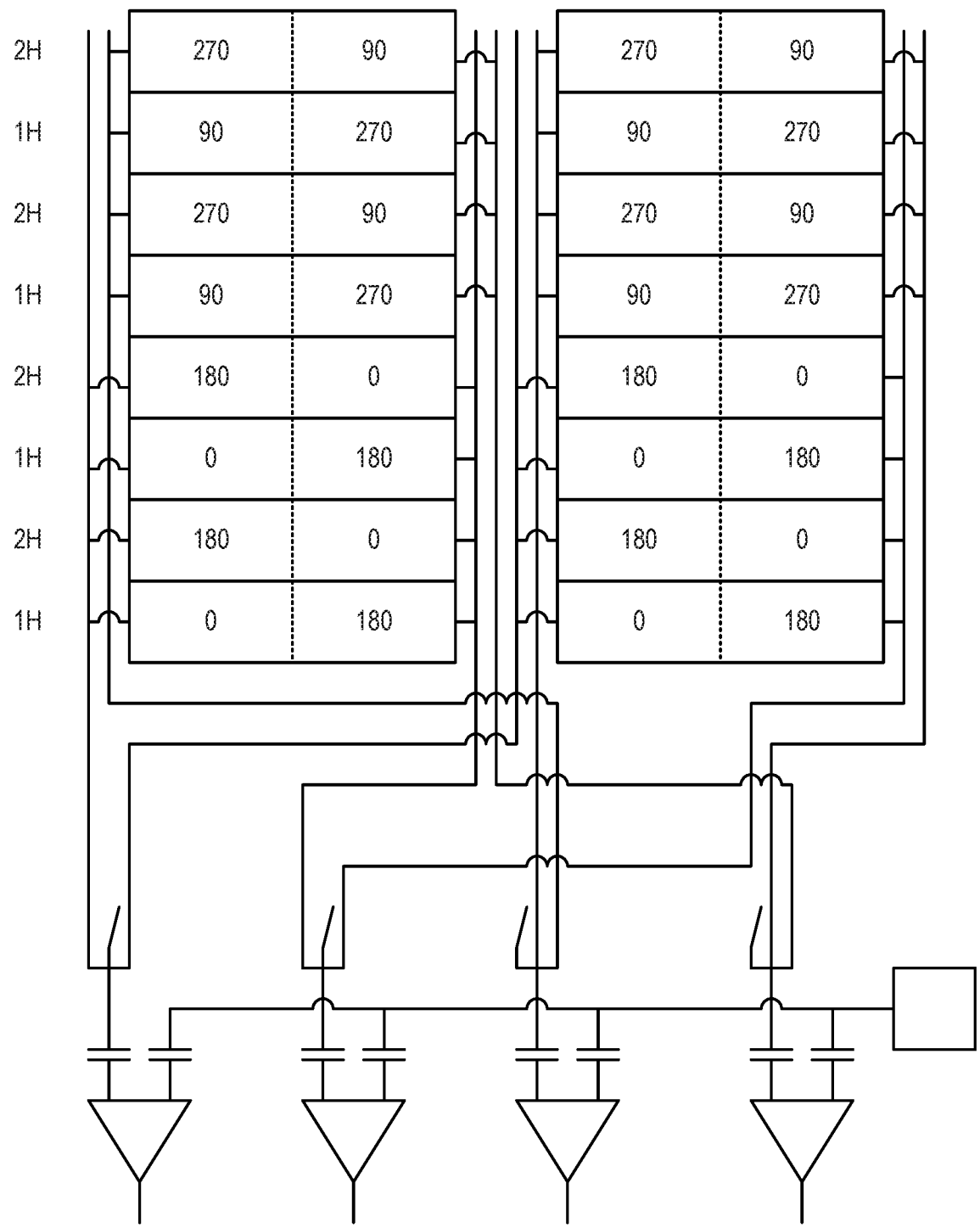
Figure 9B:
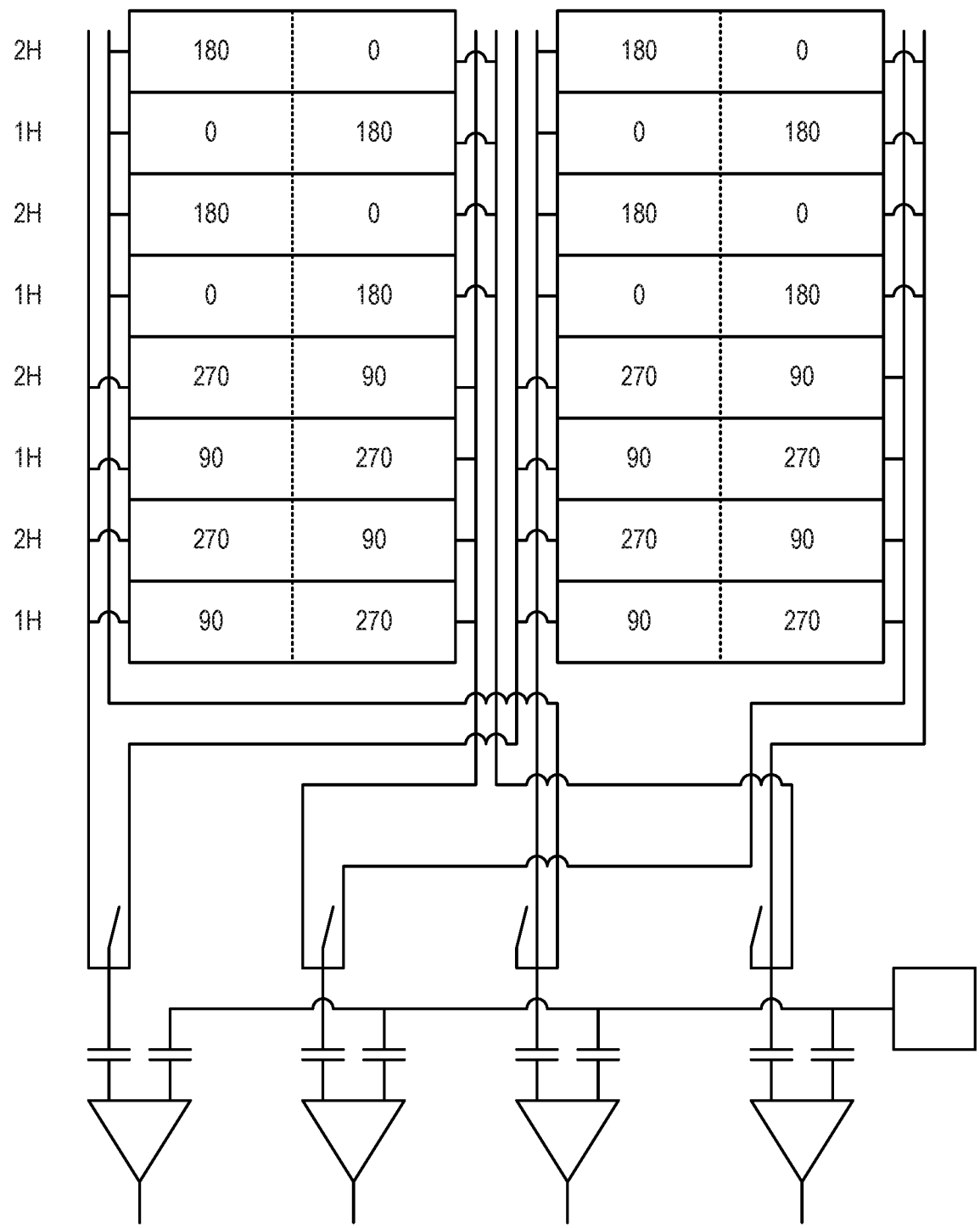

In each of the above modes, four frames are used to obtain the quantities Q and I because four phases per pixel are utilized. In some modes, however, the quantities Q and I are obtained in only two frames by utilizing two phases per pixel. These modes may be referred to as IQ modes. The IQ modes may be implemented with any of the normal mode, the skipping modes, the binning modes, and the hybrid modes described above. FIGS. 9A-9B illustrates a 2×2 binning IQ mode.

In FIG. 9A, an $N^{th}$ frame is illustrated. As illustrated, the first and third switches of the first switch circuitry 431 and the second switch circuitry 432 in the left column and the second and third switches of the first switch circuitry 431 and the second switch circuitry 432 in the right column are closed, while the second switch of the first switch circuitry 431 and the second switch circuitry 432 in the left column and the first switch of the first switch circuitry 431 and the second switch circuitry 432 in the right column is open. In a first horizontal period 1H, the first and third rows (counting from the bottom) of pixel circuits 410 are driven such that Tap A of the corresponding pixel circuit 410 operates in the 0 phase and Tap B of the corresponding pixel circuit 410 operates in the 180 phase, and the fifth and seventh rows of pixel circuits 410 are driven such that Tap A of the corresponding pixel circuit 410 operates in the 90 phase and Tap B of the corresponding pixel circuit 410 operates in the 270 phase.

In a second horizontal period 2H, the second and fourth rows of pixel circuits 410 are driven such that Tap A of the corresponding pixel circuit 410 operates in the 180 phase and Tap B of the corresponding pixel circuit 410 operates in the 0 phase, and the fifth and seventh rows of pixel circuits 410 are driven such that Tap A of the corresponding pixel circuit 410 operates in the 270 phase and Tap B of the corresponding pixel circuit 410 operates in the 90 phase.

During the first horizontal period 1H and the second horizontal period 2H, the signals for the bottom four rows of the pixel circuits 410 in both the left column and the right column are provided to the comparators 450 for the left column through the first switch circuitry 431 and the second switch circuitry 432 for the left column, while the signals for the top four rows of the pixel circuits 410 in both the left column and the right column are provided to the comparators 450 for the right column through the first switch circuitry 431 and the second switch circuitry 432 for the right column.

In FIG. 9B, an $(N+1)^{th}$ frame is illustrated. The configuration of each of the switches in the first switch circuitry 431 and the second switch circuitry 432 remains the same as in FIG. 9A. In a first horizontal period 1H, the first and third rows of pixel circuits 410 are driven such that Tap A of the corresponding pixel circuit 410 operates in the 90 phase and Tap B of the corresponding pixel circuit 410 operates in the 270 phase, and the fifth and seventh rows of pixel circuits 410 are driven such that Tap A of the corresponding pixel circuit 410 operates in the 0 phase and Tap B of the corresponding pixel circuit 410 operates in the 180 phase.

In a second horizontal period 2H, the second and fourth rows of pixel circuits 410 are driven such that Tap A of the corresponding pixel circuit 410 operates in the 270 phase and Tap B of the corresponding pixel circuit 410 operates in the 90 phase, and the fifth and seventh rows of pixel circuits 410 are driven such that Tap A of the corresponding pixel circuit 410 operates in the 180 phase and Tap B of the corresponding pixel circuit 410 operates in the 0 phase.

During the first horizontal period 1H and the second horizontal period 2H, the signals for the bottom four rows of the pixel circuits 410 in both the left column and the right column are provided to the comparators 450 for the left column through the first switch circuitry 431 and the second switch circuitry 432 for the left column, while the signals for the top four rows of the pixel circuits 410 in both the left column and the right column are provided to the comparators 450 for the right column through the first switch circuitry 431 and the second switch circuitry 432 for the right column.

IQ Mosaic/Demosaic Readout Modes

Figure 10:
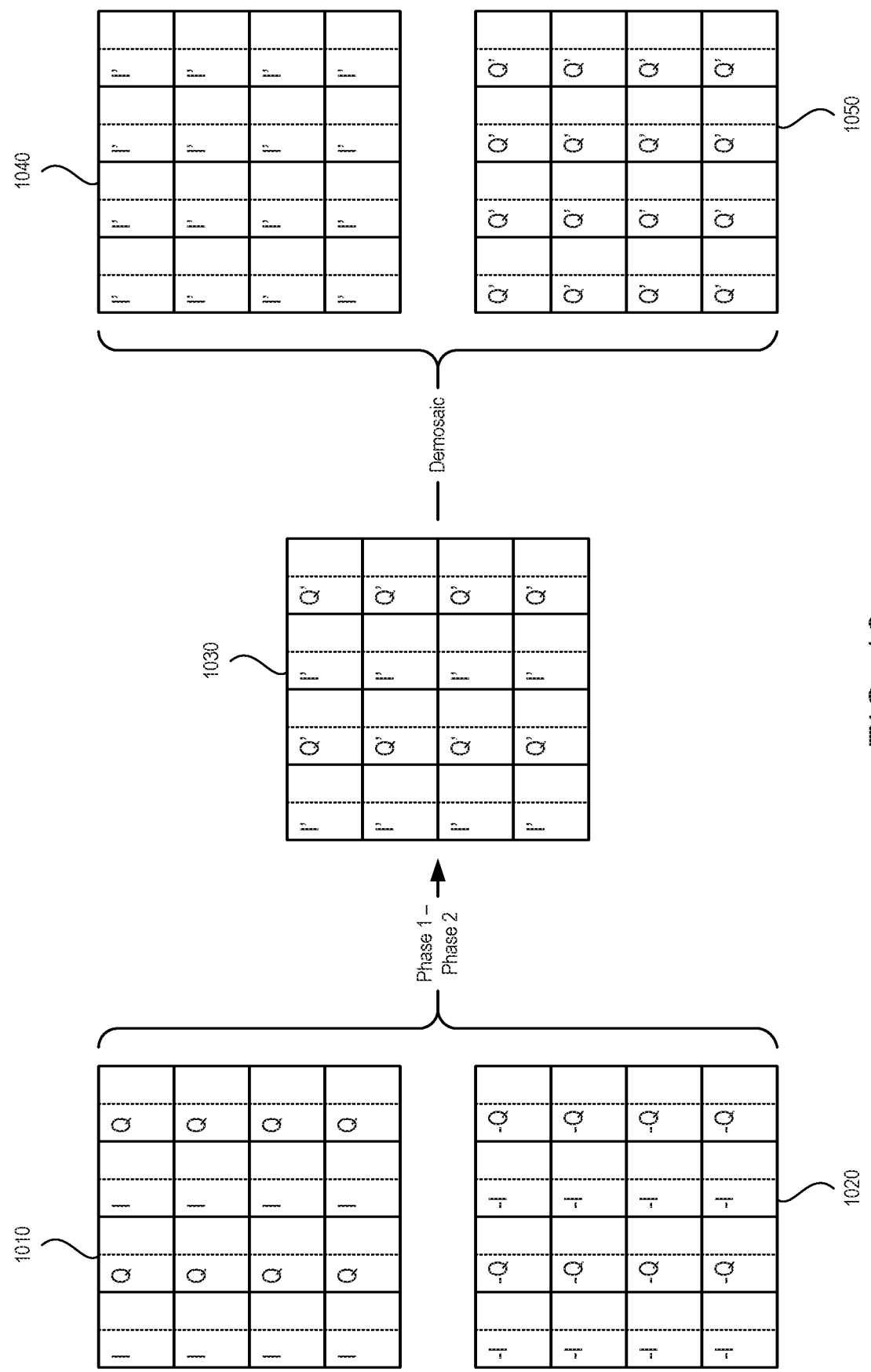
FIG. 10 illustrates an exemplary IQ mosaic mode for use with various aspects of the present disclosure.

FIG. 10 illustrates an exemplary mosaic/demosaic (mdm) process which may be implemented with the modes, as will be discussed in more detail below. As illustrated in FIG. 10, a first data block 1010 and a second data block 1020 are obtained. The first data block 1010 and the second data block may be obtained, for example, by the processes discussed with regard to FIGS. 11A-14B.

The first data block 1010 includes pixel data corresponding to the quantities I and Q in alternating columns. The second data block 1020 includes pixel data corresponding to the quantities −I and −Q in alternating columns. By subtracting the second data block 1020 from the first data block 1010, a third data block 1030 is obtained. The third data block 1030 includes data corresponding to the quantities Q' and I', which correspond to the pixel data with ambient error canceled.

Among the sources of ambient error are ambient light, which is generally the same for both Tap A and Tap B of a given pixel circuit 410, and tap gain mismatch, which is not necessarily the same for both Tap A and Tap B of the given pixel circuit 410. The ambient error may be canceled through an IQ demosaic process, in which the third data block 1030 is converted into a fourth data block 1040 and a fifth data block 1050. The fourth data block 1040 includes data corresponding to the quantity I' in all columns, and the fifth data block 1050 includes data corresponding to the quantity Q' in all columns.

The IQ demosaic process may be represented by the following expression (1):

$$\operatorname{atan}\left(\frac{Q + Q_{error}}{I + I_{error}}\right) \quad (1)$$

Q, I, $Q_{error}$, and $I_{error}$ may be given by the following expressions (2)-(4), respectively:

$$Q = x\alpha - y\beta \quad (2)$$

$$I = m\alpha - n\beta \quad (3)$$

$$Q_{error} = I_{error} = \gamma\alpha - \gamma\beta \quad (4)$$

Above, the quantities x, y, m, and n correspond to amounts of active light (for example, light emitted by the light generator 111 illustrated in FIGS. 1A-B); the quantity γ corresponds to an amount of ambient light; and α and β correspond to tap gain mismatch. By utilizing the IQ demosaic process based on the first data block 1010 and the second data block 1020, expression (1) becomes the following expression (5):

$$\operatorname{atan}\left(\frac{\begin{array}{c}(x-y)(\alpha_{pix1} + \beta_{pix1}) + \\ ((\gamma\alpha_{pix1} - \gamma\beta_{pix1}) - (\gamma\alpha_{pix1} - \gamma\beta_{pix1}))\end{array}}{\begin{array}{c}(m-n)(\alpha_{pix2} + \beta_{pix2}) + \\ ((\gamma\alpha_{pix2} - \gamma\beta_{pix2}) - (\gamma\alpha_{pix2} - \gamma\beta_{pix2}))\end{array}}\right) =$$

$$\operatorname{atan}\left(\frac{(x-y)(\alpha_{pix1} + \beta_{pix1})}{(m-n)(\alpha_{pix2} + \beta_{pix2})}\right) = \operatorname{atan}\left(\frac{Q'}{I'}\right) \quad (5)$$

Thus, the ambient error is canceled. The quantities I and Q may be obtained in various modes, as illustrated in FIGS. 11A-14B.

Figure 11A:
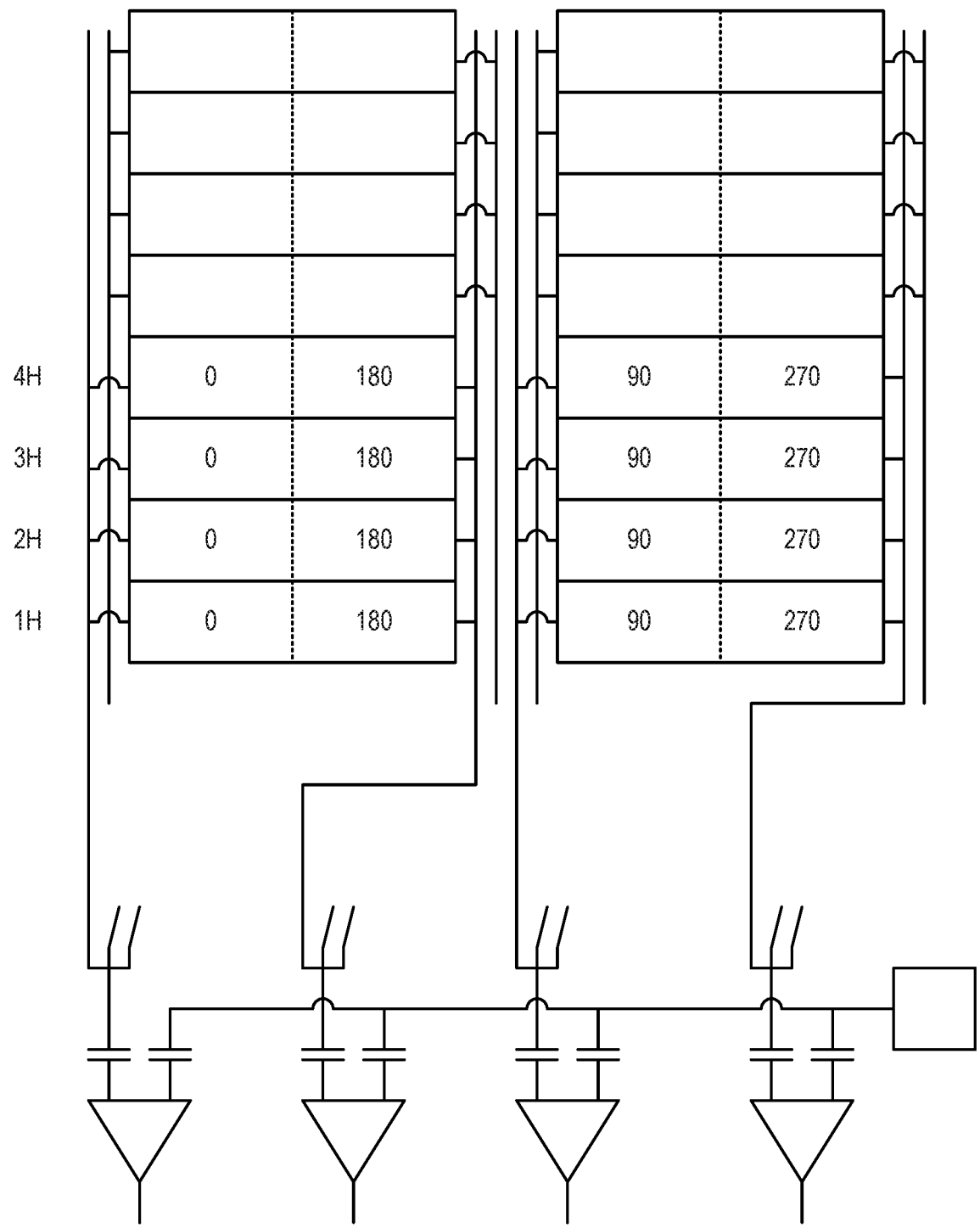
FIGS. 11A-14B illustrate exemplary readout modes and operations in the exemplary readout circuit of FIG. 4.
Figure 11B:
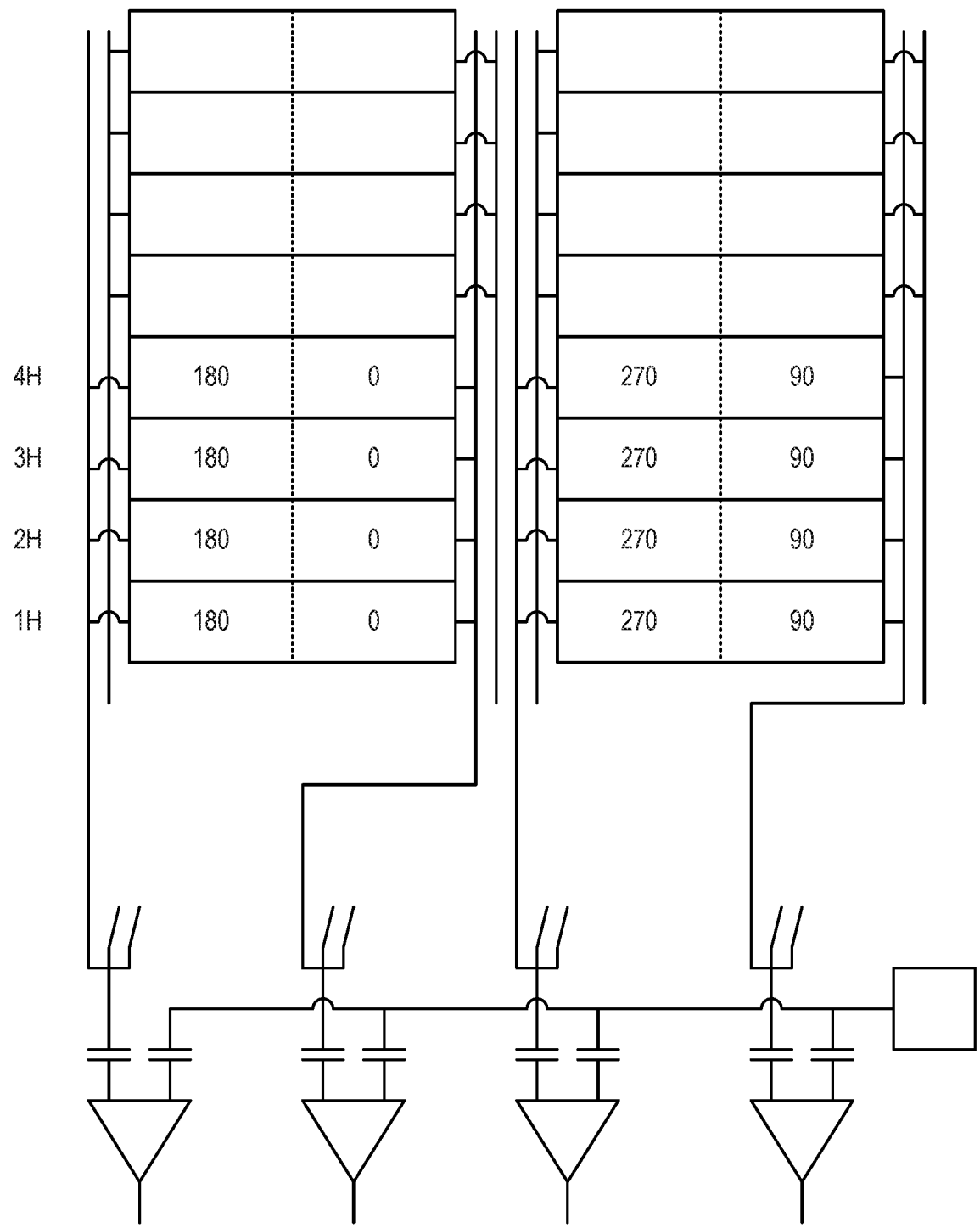

FIGS. 11A-B illustrate a normal IQ mdm mode for an $N^{th}$ frame and an $(N+1)^{th}$ frame respectively. In FIG. 11A, the $N^{th}$ frame is illustrated. As illustrated, the first switch of each of the first switch circuitry 431 and the second switch circuitry 432 is closed, while the second and third switches of each of the first switch circuitry 431 and the second switch circuitry 432 are open. The pixel circuits 410 in the bottom four rows are driven in four consecutive horizontal periods 1H to 4H such that, in a respective horizontal period Tap A of the corresponding pixel circuit 410 in the left column operates in the 0 phase, Tap B of the corresponding pixel circuit 410 in the left column operates in the 180 phase, Tap A of the corresponding pixel circuit 410 in the right column operates in the 90 phase, and Tap B of the corresponding pixel circuit 410 in the right column operates in the 270 phase.

In FIG. 11B, the (N+1)$^{th}$ frame is illustrated. As illustrated, the states of the first switch circuitry 431 and the second switch circuitry 432 are the same as in FIG. 11A; however, the phases of the pixel circuits 410 are modified. Thus, the pixel circuits 410 in the bottom four rows are driven in four consecutive horizontal periods 1H to 4H such that, in a respective horizontal period Tap A of the corresponding pixel circuit 410 operates in the 180 phase, Tap B of the corresponding pixel circuit 410 in the left column operates in the 0 phase, Tap A of the corresponding pixel circuit 410 in the right column operates in the 270 phase, and Tap B of the corresponding pixel circuit 410 in the right column operates in the 0 phase.

In the above manner, the quantities I and Q may be obtained in the N$^{th}$ frame, and the quantities −I and −Q may be obtained in the (N+1)$^{th}$ frame. The quantities may then be subjected to the IQ mosaic/demosaic process illustrated in FIG. 10.

Figure 12A:
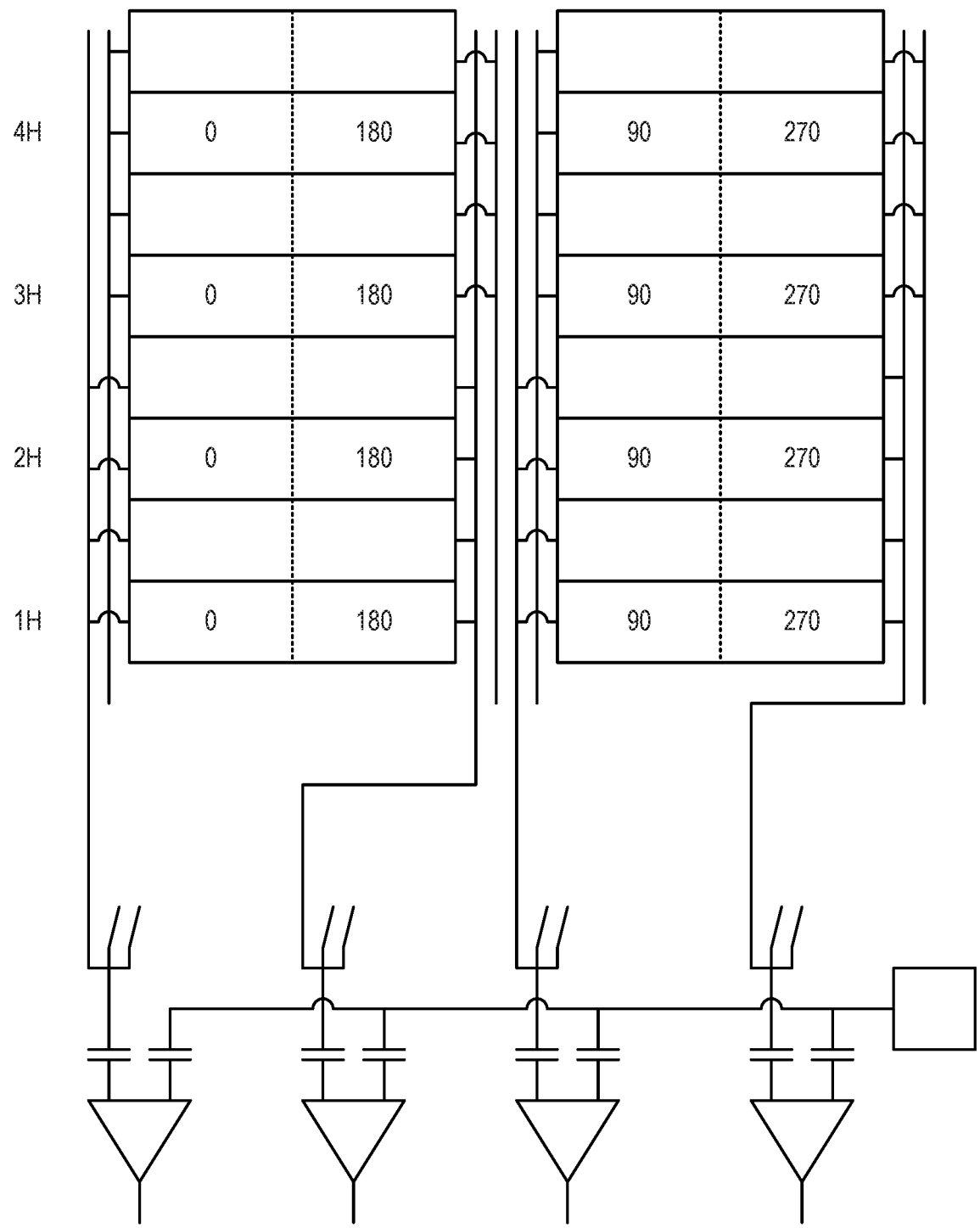
Figure 12B:
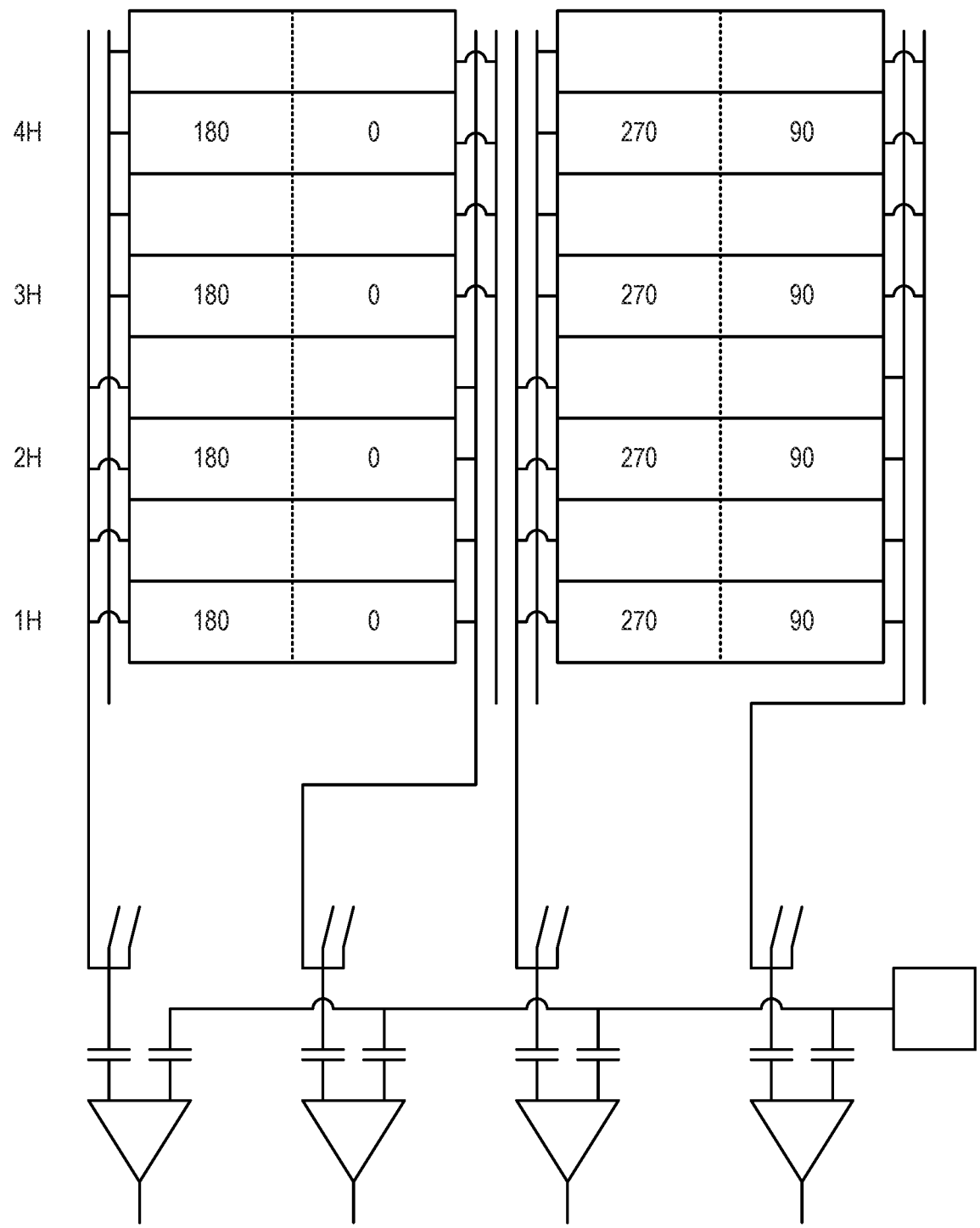

FIGS. 12A-B illustrate a skip 1 IQ mdm mode for an N$^{th}$ frame and an (N+1) frame respectively. In FIG. 12A, the N$^{th}$ frame is illustrated. As illustrated, the first switch of each of the first switch circuitry 431 and the second switch circuitry 432 is closed, while the second and third switches of each of the first switch circuitry 431 and the second switch circuitry 432 are open. The pixel circuits 410 in the first, third, fifth, and seventh rows are driven in four consecutive horizontal periods 1H to 4H such that in a respective horizontal period Tap A of the corresponding pixel circuit 410 in the left column operates in the 0 phase, Tap B of the corresponding pixel circuit 410 in the left column operates in the 180 phase, Tap A of the corresponding pixel circuit 410 in the right column operates in the 90 phase, and Tap B of the corresponding pixel circuit 410 in the right column operates in the 270 phase. The pixel circuits 410 in the second, fourth, sixth, and eighth rows are skipped.

In FIG. 12B, the (N+1)$^{th}$ frame is illustrated. As illustrated, the states of the first switch circuitry 431 and the second switch circuitry 432 are the same as in FIG. 12A; however, the phases of the pixel circuits 410 are modified. Thus, the pixel circuits 410 in the first, third, fifth, and seventh rows are driven in four consecutive horizontal periods 1H to 4H such that in a respective horizontal period Tap A of the corresponding pixel circuit 410 operates in the 180 phase, Tap B of the corresponding pixel circuit 410 in the left column operates in the 0 phase, Tap A of the corresponding pixel circuit 410 in the right column operates in the 270 phase, and Tap B of the corresponding pixel circuit 410 in the right column operates in the 0 phase. The pixel circuits 410 in the second, fourth, sixth, and eighth rows are again skipped.

In the above manner, the quantities I and Q may be obtained in the N$^{th}$ frame, and the quantities −I and −Q may be obtained in the (N+1)$^{th}$ frame. The quantities may then be subjected to the IQ mosaic/demosaic process illustrated in FIG. 10.

Figure 13A:
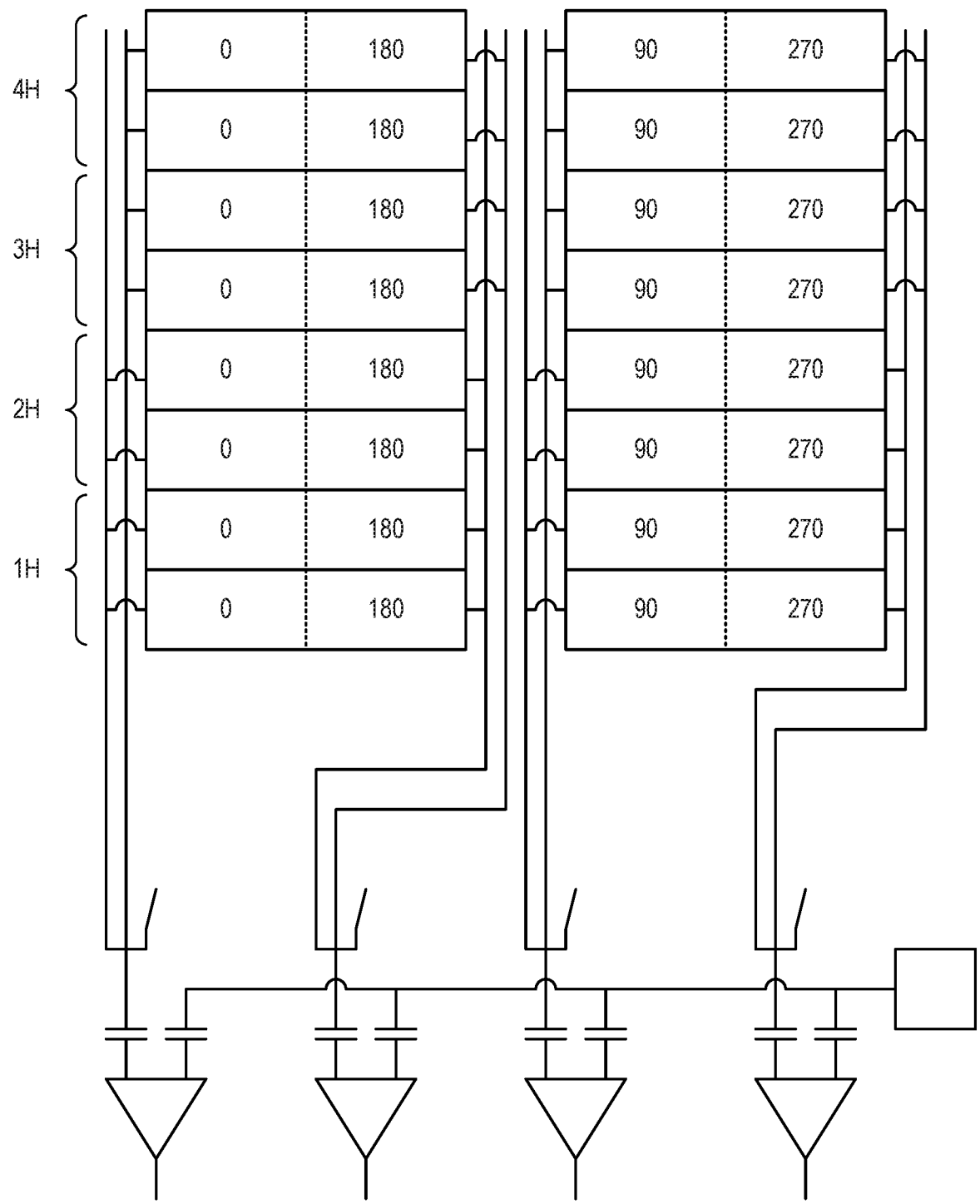
Figure 13B:
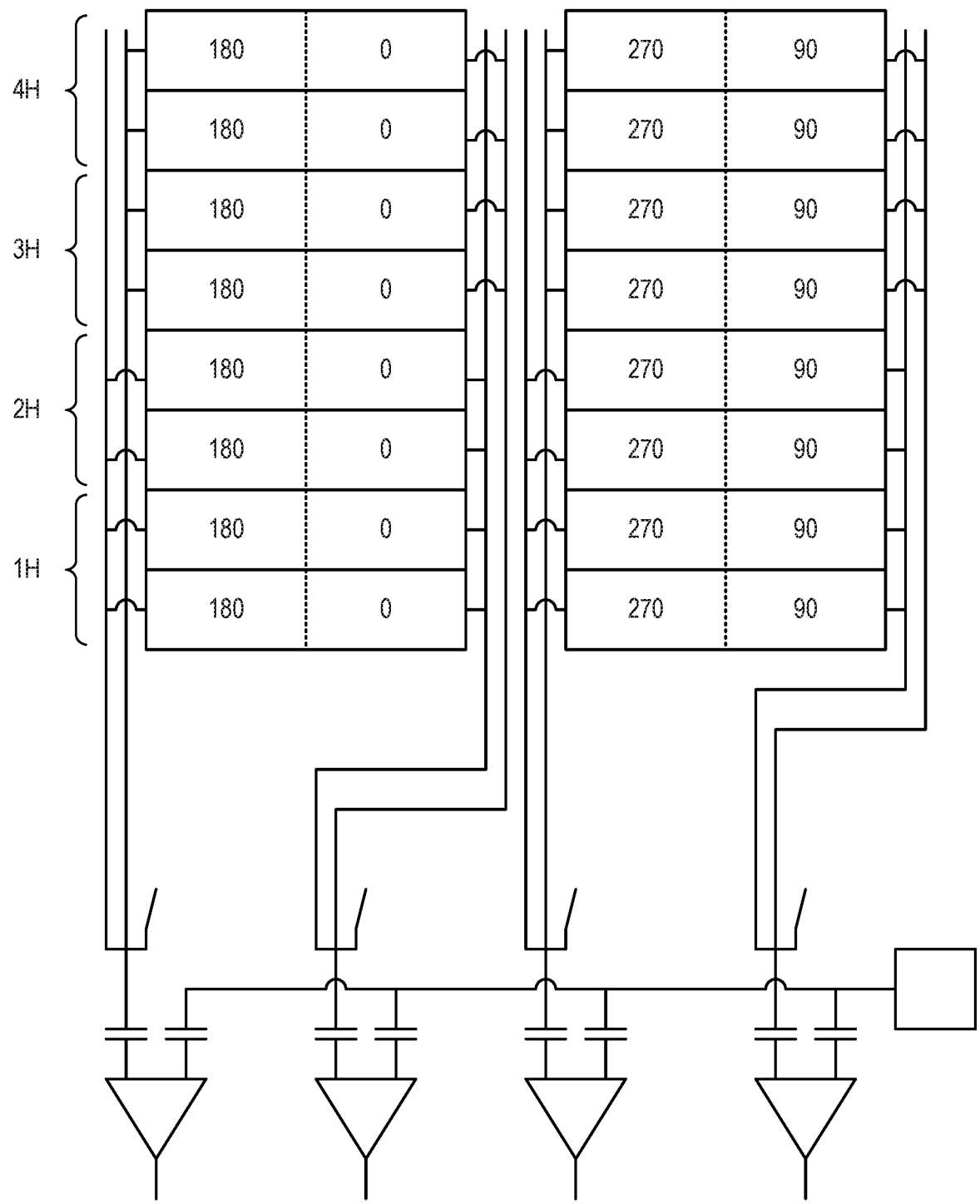

FIGS. 13A-B illustrates a 2×2 pixel binning IQ mdm mode for an N$^{th}$ frame and an (N+1)$^{th}$ frame, respectively. In FIG. 13A, the N$^{th}$ frame is illustrated. The first and second switches of each of the first switch circuitry 431 and the second switch circuitry 432 are closed, while the third switch of each of the first switch circuitry 431 and the second switch circuitry 432 is open. The pixel circuits 410 in pairs of rows are driven in four consecutive horizontal periods 1H to 4H such that in a respective horizontal period Tap A of the corresponding pixel circuit 410 in the left column operates in the 0 phase, Tap B of the corresponding pixel circuit 410 in the left column operates in the 180 phase, Tap A of the corresponding pixel circuit 410 in the right column operates in the 90 phase, and Tap B of the corresponding pixel circuit 410 in the right column operates in the 270 phase.

In a first horizontal period 1H, the bottom two rows of pixel circuits 410 are driven such that Tap A and Tap B of the corresponding pixel circuits 410 operate in the phases noted above. During the first horizontal period 1H, the signals for the first and second rows of the pixel circuits 410 in the left column are provided to the comparators 450 for the left column through the first switch circuitry 431 and the second switch circuitry 432 for the left column, while the signals for the first and second rows of the pixel circuits 410 in the right column are provided to the comparators 450 for the right column through the first switch circuitry 431 and the second switch circuitry 432 for the right column.

In a second horizontal period 2H, the third and fourth rows of pixel circuits 410 are driven such that Tap A and Tap B of the corresponding pixel circuits 410 operate in the phases noted above. During the second horizontal period 2H, the signals for the third and fourth rows of the pixel circuits 410 in the left column are provided to the comparators 450 for the left column through the first switch circuitry 431 and the second switch circuitry 432 for the left column, while the signals for the third and fourth rows of the pixel circuits 410 in the right column are provided to the comparators 450 for the right column through the first switch circuitry 431 and the second switch circuitry 432 for the right column. A third horizontal period 3H and a fourth horizontal period 4H follow similarly.

In FIG. 13B, the (N+1)$^{th}$ frame is illustrated. The first and second switches of each of the first switch circuitry 431 and the second switch circuitry 432 are closed, while the third switch of each of the first switch circuitry 431 and the second switch circuitry 432 is open. The pixel circuits 410 in pairs of rows are driven in four consecutive horizontal periods 1H to 4H such that in a respective horizontal period Tap A of the corresponding pixel circuit 410 in the left column operates in the 180 phase, Tap B of the corresponding pixel circuit 410 in the left column operates in the 0 phase, Tap A of the corresponding pixel circuit 410 in the right column operates in the 270 phase, and Tap B of the corresponding pixel circuit 410 in the right column operates in the 90 phase.

In a first horizontal period 1H, the bottom two rows of pixel circuits 410 are driven such that Tap A and Tap B of the corresponding pixel circuits 410 operate in the phases noted above. During the first horizontal period 1H, the signals for the first and second rows of the pixel circuits 410 in the left column are provided to the comparators 450 for the left column through the first switch circuitry 431 and the second switch circuitry 432 for the left column, while the signals for the first and second rows of the pixel circuits 410 in the right column are provided to the comparators 450 for the right column through the first switch circuitry 431 and the second switch circuitry 432 for the right column.

In a second horizontal period 2H, the third and fourth rows of pixel circuits 410 are driven such that Tap A and Tap B of the corresponding pixel circuits 410 operate in the phases noted above. During the second horizontal period 2H, the signals for the third and fourth rows of the pixel circuits 410 in the left column are provided to the comparators 450 for the left column through the first switch circuitry 431 and the second switch circuitry 432 for the left column, while the signals for the third and fourth rows of the pixel circuits 410 in the right column are provided to the comparators 450 for the right column through the first switch circuitry 431 and the second switch circuitry 432 for the right column. A third horizontal period 3H and a fourth horizontal period 4H follow similarly.

In the above manner, the quantities I and Q may be obtained in the $N^{th}$ frame, and the quantities –I and –Q may be obtained in the $(N+1)^{th}$ frame. The quantities may then be subjected to the IQ mosaic/demosaic process illustrated in FIG. 10.

Figure 14A:
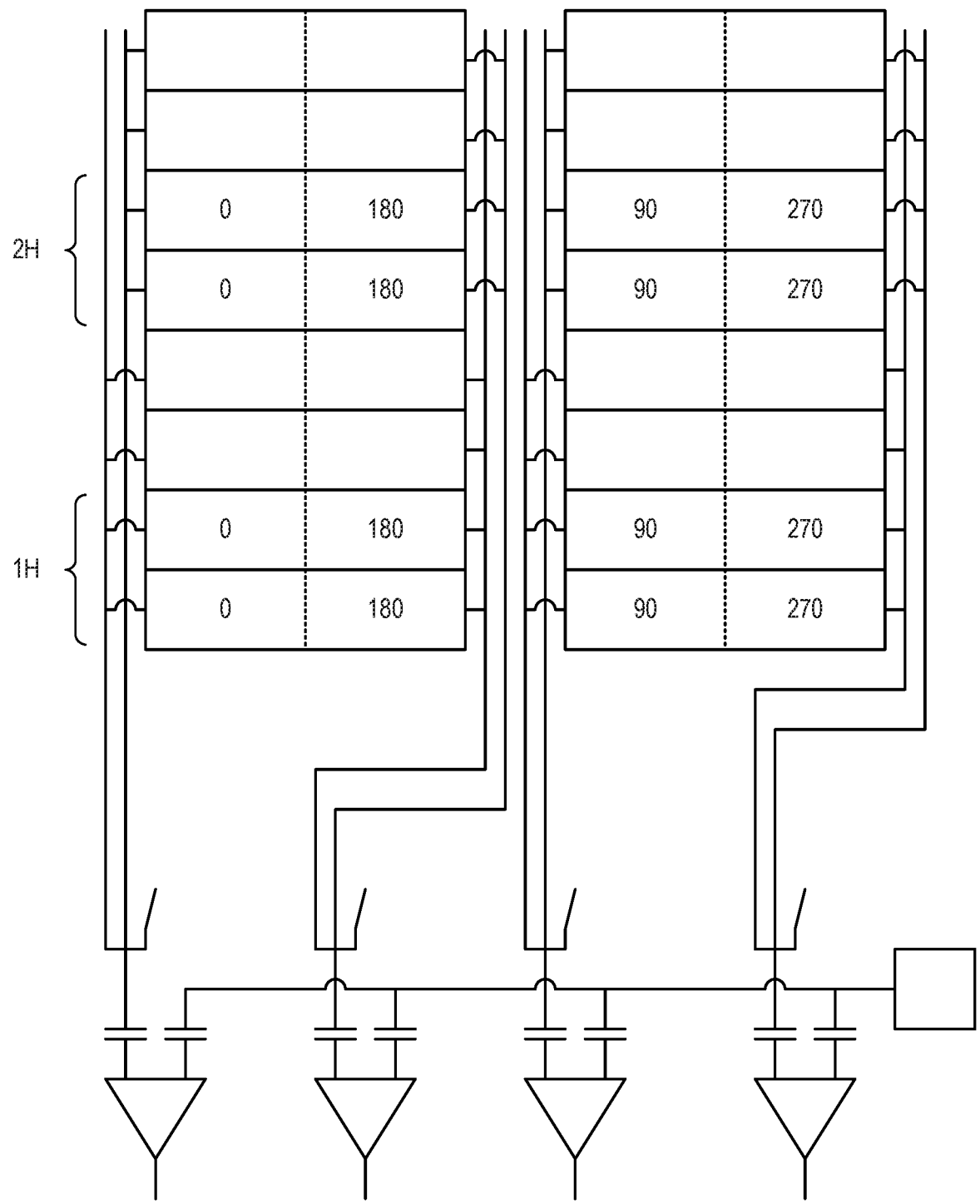
Figure 14B:
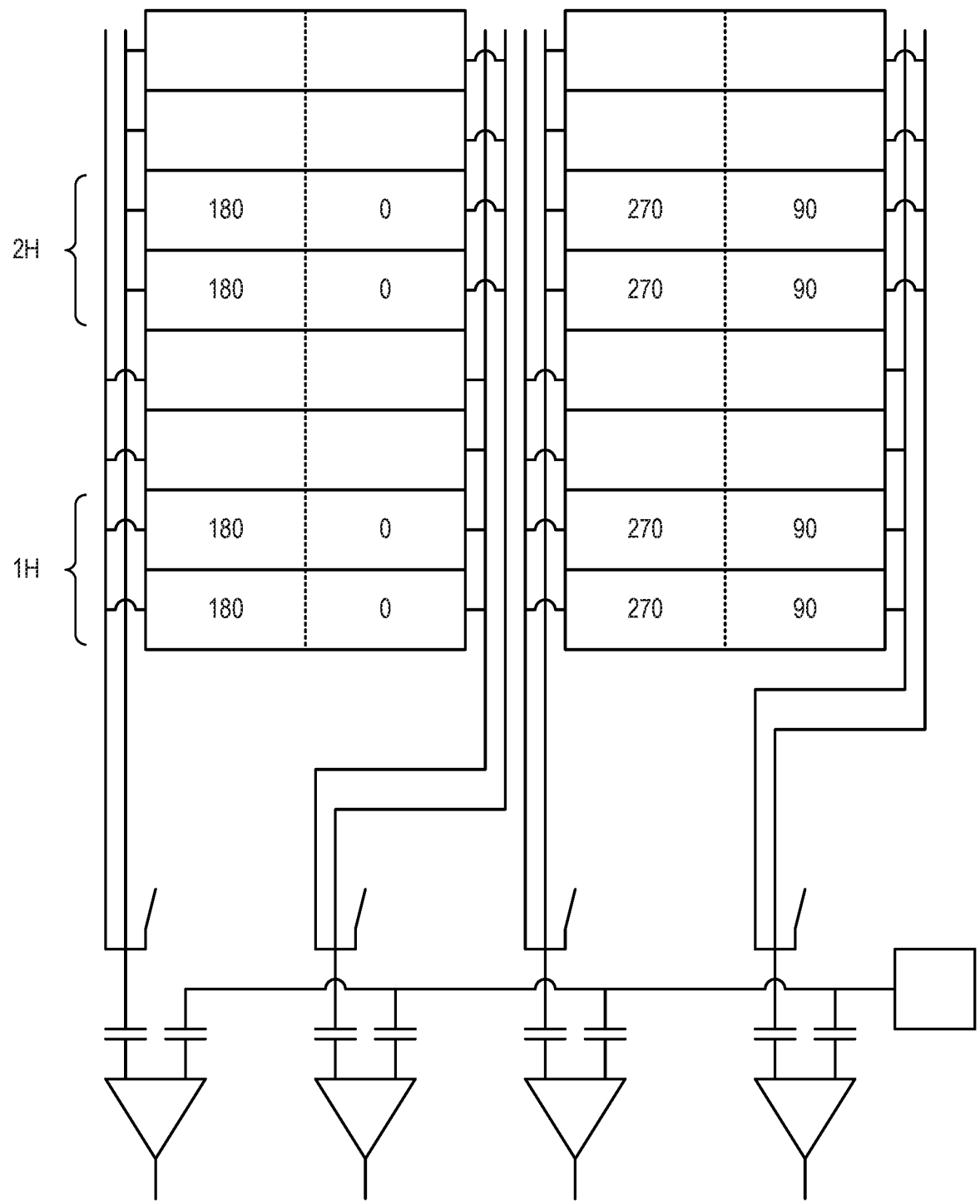

FIGS. 14A-B illustrates a 2×2 pixel binning skip 1 IQ mdm mode for an $N^{th}$ frame and an $(N+1)^{th}$ frame, respectively. In FIG. 14A, the $N^{th}$ frame is illustrated. The first and second switches of each of the first switch circuitry 431 and the second switch circuitry 432 are closed, while the third switch of each of the first switch circuitry 431 and the second switch circuitry 432 is open. The pixel circuits 410 in every other pair of rows are driven in two consecutive horizontal periods 1H and 2H such that in a respective horizontal period Tap A of the corresponding pixel circuit 410 in the left column operates in the 0 phase, Tap B of the corresponding pixel circuit 410 in the left column operates in the 180 phase, Tap A of the corresponding pixel circuit 410 in the right column operates in the 90 phase, and Tap B of the corresponding pixel circuit 410 in the right column operates in the 270 phase.

In a first horizontal period 1H, the bottom two rows of pixel circuits 410 are driven such that Tap A and Tap B of the corresponding pixel circuits 410 operate in the phases noted above. During the first horizontal period 1H, the signals for the first and second rows of the pixel circuits 410 in the left column are provided to the comparators 450 for the left column through the first switch circuitry 431 and the second switch circuitry 432 for the left column, while the signals for the first and second rows of the pixel circuits 410 in the right column are provided to the comparators 450 for the right column through the first switch circuitry 431 and the second switch circuitry 432 for the right column.

In a second horizontal period 2H, the fifth and sixth rows of pixel circuits 410 are driven such that Tap A and Tap B of the corresponding pixel circuits 410 operate in the phases noted above. During the second horizontal period 2H, the signals for the fifth and sixth rows of the pixel circuits 410 in the left column are provided to the comparators 450 for the left column through the first switch circuitry 431 and the second switch circuitry 432 for the left column, while the signals for the third and fourth rows of the pixel circuits 410 in the right column are provided to the comparators 450 for the right column through the first switch circuitry 431 and the second switch circuitry 432 for the right column. A third horizontal period 3H and a fourth horizontal period 4H follow similarly. The third, fourth, seventh, and eighth rows of pixel circuits 410 are skipped.

In FIG. 14B, the $(N+1)^{th}$ frame is illustrated. The first and second switches of each of the first switch circuitry 431 and the second switch circuitry 432 are closed, while the third switch of each of the first switch circuitry 431 and the second switch circuitry 432 is open. The pixel circuits 410 in every other pair of rows are driven in two consecutive horizontal periods 1H and 2H such that in a respective horizontal period Tap A of the corresponding pixel circuit 410 in the left column operates in the 180 phase, Tap B of the corresponding pixel circuit 410 in the left column operates in the 0 phase, Tap A of the corresponding pixel circuit 410 in the right column operates in the 270 phase, and Tap B of the corresponding pixel circuit 410 in the right column operates in the 90 phase.

In a first horizontal period 1H, the bottom two rows of pixel circuits 410 are driven such that Tap A and Tap B of the corresponding pixel circuits 410 operate in the phases noted above. During the first horizontal period 1H, the signals for the first and second rows of the pixel circuits 410 in the left column are provided to the comparators 450 for the left column through the first switch circuitry 431 and the second switch circuitry 432 for the left column, while the signals for the first and second rows of the pixel circuits 410 in the right column are provided to the comparators 450 for the right column through the first switch circuitry 431 and the second switch circuitry 432 for the right column.

In a second horizontal period 2H, the fifth and sixth rows of pixel circuits 410 are driven such that Tap A and Tap B of the corresponding pixel circuits 410 operate in the phases noted above. During the second horizontal period 2H, the signals for the fifth and sixth rows of the pixel circuits 410 in the left column are provided to the comparators 450 for the left column through the first switch circuitry 431 and the second switch circuitry 432 for the left column, while the signals for the third and fourth rows of the pixel circuits 410 in the right column are provided to the comparators 450 for the right column through the first switch circuitry 431 and the second switch circuitry 432 for the right column. A third horizontal period 3H and a fourth horizontal period 4H follow similarly. The third, fourth, seventh, and eighth rows of pixel circuits 410 are skipped.

In the above manner, the quantities I and Q may be obtained in the $N^{th}$ frame, and the quantities –I and –Q may be obtained in the $(N+1)^{th}$ frame. The quantities may then be subjected to the IQ mosaic/demosaic process illustrated in FIG. 10.

Operation Methods

An imaging system, such as the TOF imaging system 101a or the TOF imaging system 101b illustrated in FIGS. 1A-B, may be operated to implement any of the above readout modes and thereby provide for object detection, depth map generation, face/gesture recognition, imaging, or combinations of the above.

Figure 15:
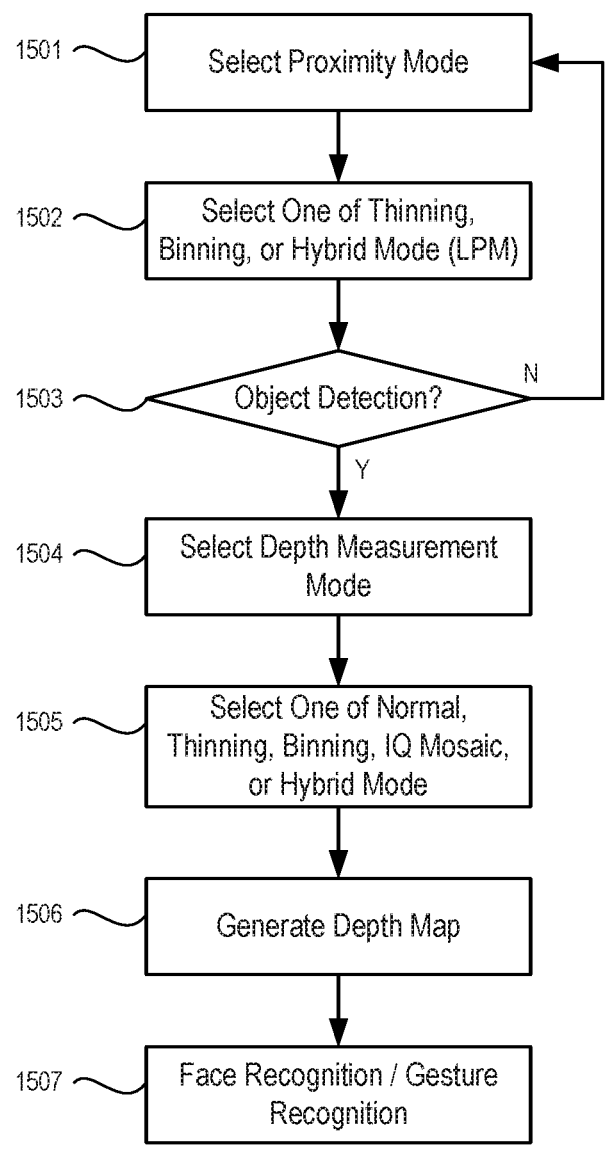
FIG. 15 illustrates an exemplary operation method according to various aspects of the present disclosure.

FIG. 15 illustrates an exemplary imaging method in accordance with the present disclosure. The imaging method of may be implemented by the TOF imaging system 101a or the TOF imaging system 10b. At 1501, a proximity mode selection is made. The selection may be made by a local user, for example by an operation on a button or touch screen of a device implementing the TOF imaging system 101a or the TOF imaging system 101b. The selection may also be made by a controller of a device implementing the TOF imaging system 101a or the TOF imaging system 101b, for example by a remote user request or an automatic or pre-programmed operation. In the proximity mode, at 1502 a low power mode (LPM) may be selected; again, either by a local user and/or a controller of the device. The low power mode may be any one of the thinning modes, the binning modes, or the hybrid modes described above. At 1503, an object detection determination is made. If no object is detected, the exemplary method may reinitialize or restart.

If an object is detected, at 1504 a depth measurement mode is selected. As above, the selection may be made by a local user and/or a controller of the device. In the depth measurement mode, at 1505 a readout mode is selected by the local user and/or the controller of the device. The readout mode may be any one of the normal mode, the thinning modes, the binning modes, the IQ mosaic modes, the mdm modes, or the hybrid modes described above. At 1506, the device generates a depth map. At 1507, the device performs a face recognition operation and/or a gesture recognition operation. In some aspects of the present disclosure, the exemplary imaging method may only generate a depth map (and not perform a recognition operation) or may only perform a recognition operation (and not generate a full depth map).

In this manner, in 1501 to 1503 the device determines whether an object is present and, if so, in 1504 to 1506/1507 the device may generate a depth map and/or perform a recognition operation.

Figure 16:
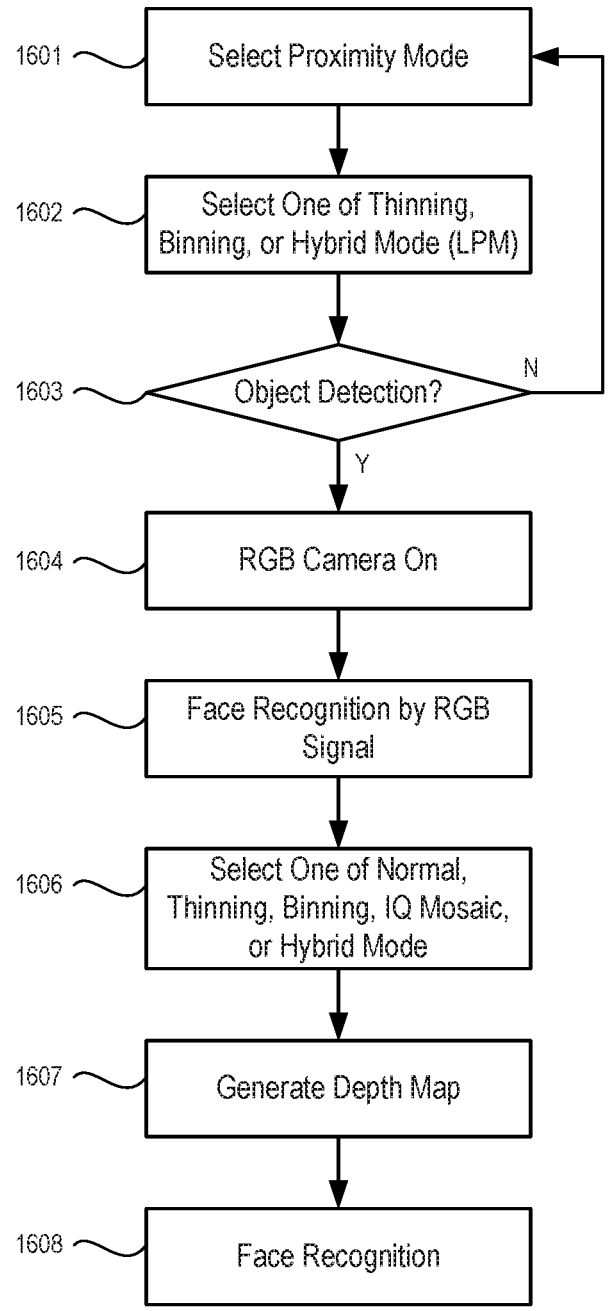
FIG. 16 illustrates another exemplary operation method according to various aspects of the present disclosure.

FIG. 16 illustrates another exemplary imaging method in accordance with the present disclosure. The imaging method of may be implemented by the TOF imaging system 10b, which incorporates an RGB sensor in addition to a TOF sensor. At 1601, a proximity mode selection is made. The selection may be made by a local user, for example by an operation on a button or touch screen of a device implementing the TOF imaging system 101b. The selection may also be made by a controller of a device implementing the TOF imaging system 101b, for example by a remote user request or an automatic or pre-programmed operation. In the proximity mode, at 1602 a low power mode (LPM) may be selected; again, either by a local user and/or a controller of the device. The low power mode may be any one of the thinning modes, the binning modes, or the hybrid modes described above. At 1603, an object detection determination is made. If no object is detected, the exemplary method may reinitialize or restart.

If an object is detected, at 1604 a RGB camera, such as the RGB image sensor 115, may be turned on. The power-on operation may be made by a local user and/or may occur automatically by a controller of the device. Once the RGB camera is on, at 1605 a preliminary face recognition operation is performed using a signal from the RGB camera. Thereafter, at 1606 a readout mode is selected by the local user and/or the controller of the device. The readout mode may be any one of the normal mode, the thinning modes, the binning modes, the IQ mosaic modes, the mdm modes, or the hybrid modes described above. At 1607, the device generates a depth map. At 1608, the device performs a face recognition operation. The face recognition operation may utilize inputs from the RGB camera (such as the result of the preliminary face recognition operation) and the TOF camera (such as the depth map). Additionally or alternatively, a gesture recognition may be performed. In some aspects of the present disclosure, the exemplary imaging method may only generate a depth map (and not perform a recognition operation) or may only perform a recognition operation (and not generate a full depth map).

In this manner, in 1601 to 1506 the device determines whether an object is present and, if so, in 1604 to 1607/1608 the device may generate a depth map and/or perform a recognition operation.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:
1. A time-of-flight sensor, comprising:
   a pixel array including a plurality of pixel circuits arranged in an array, wherein a first column of the array includes:
      a first pixel circuit including a first photodiode, a first capacitor coupled to the first photodiode, and a second capacitor coupled to the first photodiode, and
      a second pixel circuit including a second photodiode, a third capacitor coupled to the second photodiode, and a fourth capacitor coupled to the second photodiode;
   a first signal line coupled to the first capacitor;
   a second signal line coupled to the second capacitor;
   a third signal line coupled to the third capacitor;
   a fourth signal line coupled to the fourth capacitor;
   a first switch circuitry;
   a second switch circuitry;

a first comparator coupled to the first signal line and the third signal line through the first switch circuitry; and
a second comparator coupled to the second signal line and the fourth signal line through the second switch circuitry.

2. The time-of-flight sensor according to claim 1, wherein a second column of the array includes:
   a third pixel circuit including a third photodiode, a fifth capacitor coupled to the third photodiode, and a sixth capacitor coupled to the third photodiode, and
   a fourth pixel circuit including a fourth photodiode, a seventh capacitor coupled to the fourth photodiode, and an eighth capacitor coupled to the fourth photodiode; and
the time-of-flight sensor further includes:
   a fifth signal line connected to the fifth capacitor,
   a sixth signal line connected to the sixth capacitor,
   a seventh signal line coupled to the seventh capacitor, and
   an eighth signal line coupled to the eighth capacitor.

3. The time-of-flight sensor according to claim 2, wherein
the first comparator is coupled to the fifth signal line through the first switch circuitry, and
the second comparator is coupled to the sixth signal line through the second switch circuitry.

4. The time-of-flight sensor according to claim 2, further comprising:
   a third switch circuitry;
   a fourth switch circuitry;
   a third comparator coupled to the fifth signal line, the seventh signal line, and the third signal line through the third switch circuitry; and
   a fourth comparator coupled to the sixth signal line, the eighth signal line, and the second signal line through the fourth switch circuitry.

5. The time-of-flight sensor according to claim 1, further comprising a timing circuit configured to control the first switch circuitry and the second switch circuitry.

6. The time-of-flight sensor according to claim 5, wherein the timing circuit is configured to cause the time-of-flight sensor to operate in one of a plurality of readout modes based on a state of the first switch circuitry and the second switch circuitry.

7. The time-of-flight sensor according to claim 6, wherein the plurality of readout modes includes a pixel thinning mode in which a predetermined number of rows of the pixel array are skipped.

8. The time-of-flight sensor according to claim 6, wherein the plurality of readout modes includes a pixel binning mode in which groups of a predetermined number of pixel circuits are combined.

9. The time-of-flight sensor according to claim 6, wherein the plurality of readout modes includes a hybrid mode in which a first predetermined number of rows of the pixel array are skipped, and in which groups of a second predetermined number of pixel circuits that are not skipped are combined.

10. The time-of-flight sensor according to claim 6, wherein the plurality of readout modes includes a mode in which the first pixel circuit is driven in a first phase and in a second phase complementary to the first phase during one horizontal period.

11. The time-of-flight sensor according to claim 1, further comprising:
   a reference signal generator configured to output a reference signal to the first comparator and the second comparator.

12. The time-of-flight sensor according to claim 11, wherein the reference signal has a periodic ramp waveform.

13. A time-of-flight system, comprising:
   a light source configured to emit a light; and
   a sensor comprising:
      a pixel array including a plurality of pixel circuits arranged in an array, wherein a column of the array includes:
         a first pixel circuit including a first photodiode, a first capacitor coupled to the first photodiode, and a second capacitor coupled to the first photodiode, and
         a second pixel circuit including a second photodiode, a third capacitor coupled to the second photodiode, and a fourth capacitor coupled to the second photodiode,
      a first signal line coupled to the first capacitor,
      a second signal line coupled to the second capacitor,
      a third signal line coupled to the third capacitor,
      a fourth signal line coupled to the fourth capacitor,
      a first switch circuitry,
      a second switch circuitry,
      a first comparator coupled to the first signal line and the third signal line through the first switch circuitry, and
      a second comparator coupled to the second signal line and the fourth signal line through the second switch circuitry.

14. The time-of-flight system according to claim 13, wherein the sensor further comprises a timing circuit configured to control the first switch circuitry and the second switch circuitry.

15. The time-of-flight system according to claim 14, wherein the timing circuit is configured to cause the sensor to operate in one of a plurality of readout modes based on a state of the first switch circuitry and the second switch circuitry.

16. The time-of-flight system according to claim 15, wherein the plurality of readout modes includes at least one of a pixel thinning mode in which a predetermined number of rows of the pixel array are skipped, a pixel binning mode in which groups of a predetermined number of pixel circuits are combined, a hybrid mode in which a first predetermined number of rows of the pixel array are skipped and in which groups of a second predetermined number of pixel circuits that are not skipped are combined, or a mode in which the first pixel circuit is driven in a first phase and in a second phase complementary to the first phase during one horizontal period.

17. The time-of-flight system according to claim 13, wherein the light source is a laser diode or a light emitting diode.

18. The time-of-flight system according to claim 14, wherein the light has a wavelength in an infrared range.

19. A system, comprising:
   a first sensor configured to generate an image data, the first sensor comprising a first pixel array; and
   a second sensor configured to generate a distance data, the second sensor comprising:
      a second pixel array including a plurality of pixel circuits arranged in an array, wherein a column of the array includes:
         a first pixel circuit including a first photodiode, a first capacitor coupled to the first photodiode, and a second capacitor coupled to the first photodiode, and a second pixel circuit including a second photodiode, a third capacitor coupled to the second photodiode, and a fourth capacitor coupled to the second photodiode,
a first signal line coupled to the first capacitor,
a second signal line coupled to the second capacitor,
a third signal line coupled to the third capacitor,
a fourth signal line coupled to the fourth capacitor,
a first switch circuitry,
a second switch circuitry,
a first comparator coupled to the first signal line and the third signal line through the first switch circuitry, and
a second comparator coupled to the second signal line and the fourth signal line through the second switch circuitry.

20. The system according to claim 19, wherein
the image data corresponds to red-green-blue (RBG) representation of an object, and
the distance data corresponds to a depth map of the object.

* * * * *